United States Patent
Chang et al.

(10) Patent No.: US 10,367,527 B2
(45) Date of Patent: Jul. 30, 2019

(54) METHOD AND APPARATUS FOR REDUCING IDLE CYCLES DURING LDPC DECODING

(71) Applicant: Marvell International Ltd., Hamilton (BM)

(72) Inventors: Yuan-Mao Chang, San Jose, CA (US); Engling Yeo, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/284,060

(22) Filed: Oct. 3, 2016

(65) Prior Publication Data

US 2017/0041024 A1    Feb. 9, 2017

Related U.S. Application Data

(63) Continuation of application No. 13/648,507, filed on Oct. 10, 2012, now Pat. No. 9,461,671.

(60) Provisional application No. 61/545,541, filed on Oct. 10, 2011.

(51) Int. Cl.
| H03M 13/11 | (2006.01) |
| H03M 13/25 | (2006.01) |
| H03M 13/00 | (2006.01) |
| H03M 13/37 | (2006.01) |

(52) U.S. Cl.
CPC ...... *H03M 13/112* (2013.01); *H03M 13/1105* (2013.01); *H03M 13/1111* (2013.01); *H03M 13/255* (2013.01); *H03M 13/3715* (2013.01); *H03M 13/616* (2013.01); *H03M 13/6337* (2013.01); *H03M 13/6508* (2013.01); *H03M 13/6561* (2013.01); *H03M 13/6577* (2013.01); *H03M 13/1102* (2013.01)

(58) Field of Classification Search
None
See application file for complete search history.

(56) References Cited

U.S. PATENT DOCUMENTS

| 8,234,536 B1 * | 7/2012 | Farjadrad ........... H03M 13/1111 370/335 |
| 9,461,671 B1 | 10/2016 | Chang et al. |
| 2004/0168114 A1 | 8/2004 | Richardson et al. |
| 2010/0122139 A1 | 5/2010 | Wang et al. |
| 2011/0087933 A1 | 4/2011 | Varnica et al. |
| 2012/0221914 A1 * | 8/2012 | Morero ............... H03M 13/015 714/752 |

(Continued)

OTHER PUBLICATIONS

"Advisory Action", U.S. Appl. No. 13/648,507, dated Jun. 21, 2018, 3 pages.

(Continued)

*Primary Examiner* — Justin R Knapp

(57) ABSTRACT

There is provided, in accordance with an embodiment, a method of decoding codewords in conjunction with a low-density parity-check (LDPC) code that defines variable nodes and check nodes, the method comprising receiving a codeword over a data channel; evaluating quality of the data channel; and iteratively updating values of the variable nodes to decode the codeword; wherein the values of the variable nodes are updated at different levels of numeric precision depending on the evaluated quality of the data channel.

20 Claims, 20 Drawing Sheets

(56) References Cited

U.S. PATENT DOCUMENTS

2013/0007554 A1    1/2013   Chen et al.

OTHER PUBLICATIONS

"Final Office Action", U.S. Appl. No. 13/648,507, dated Aug. 26, 2015, 8 pages.
"Non-Final Office Action", U.S. Appl. No. 13/648,507, dated Apr. 30, 2015, 7 pages.
"Non-Final Office Action", U.S. Appl. No. 13/648,507, dated Jun. 21, 2018, 8 pages.
"Non-Final Office Action", U.S. Appl. No. 13/648,507, dated Dec. 3, 2015, 8 pages.
"Notice of Allowance", U.S. Appl. No. 13/648,507, dated Jun. 21, 2018, 5 pages.

* cited by examiner

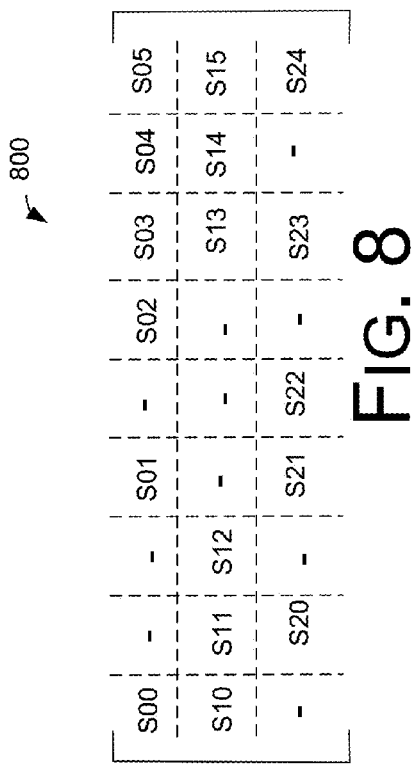

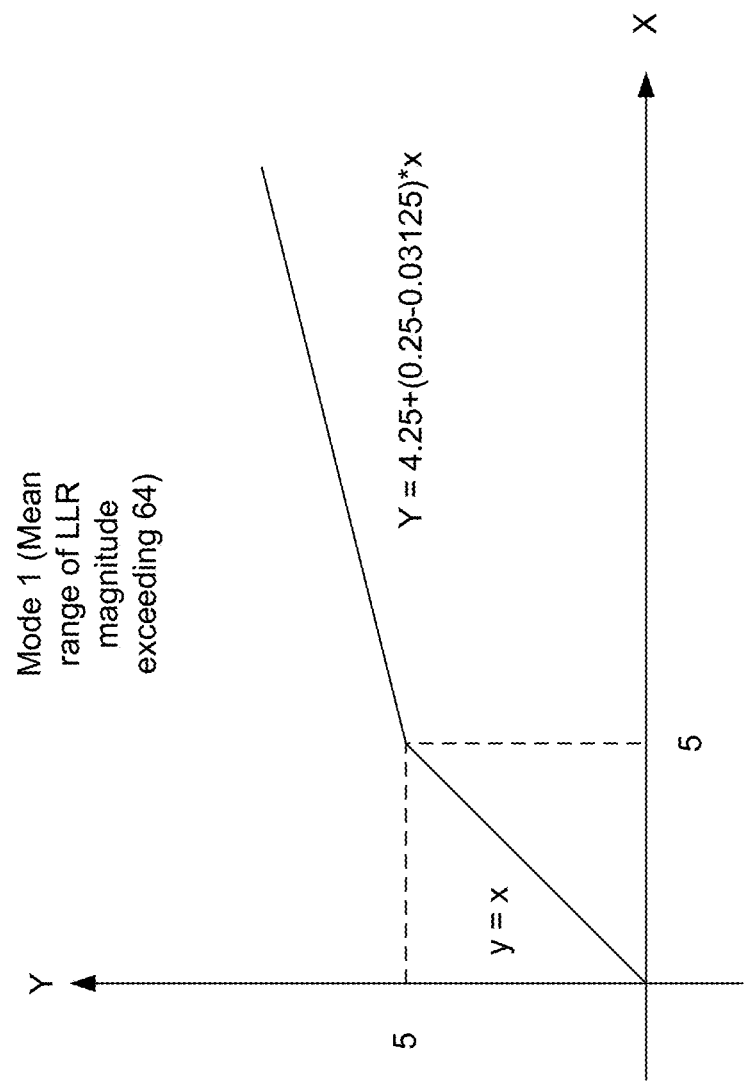

METHOD AND APPARATUS FOR REDUCING IDLE CYCLES DURING LDPC DECODING

CROSS-REFERENCE TO RELATED APPLICATION

The present disclosure is a continuation of and claims priority to U.S. patent application Ser. No. 13/648,507, filed Oct. 10, 2012, now U.S. Pat. No. 9,461,671, issued Oct. 4, 2016, which claims priority to U.S. Provisional Patent Application No. 61/545,541, filed Oct. 10, 2011, which are incorporated herein by reference.

TECHNICAL FIELD

This disclosure relates to decoding codewords using iterative check node calculations, and more particularly, to decoding codewords using low-density parity-check (LDPC) codes.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Data transfer systems, such as data transmission systems and data storage systems, are typically characterized as data channels. In data transmission systems, for example, data can be transmitted via channels such as wires, fiber-optic cable, wireless protocols, etc. In data storage systems, the storage medium itself is a data channel. In this regard, storage system channels can include, for example, hard disk platters, solid state memory, digital tape, volume holographic memory, and others.

The efficiency and reliability of data channels can depend on many factors, such as the signal-to-noise ratio (SNR) of the channel. For example, storage media having high SNRs can allow for more accurate storage and recovery of data. On the other hand, storage media having low SNRs can result in high error rates, including misread and lost data. Similarly, the accuracy of a digital data communication channel depends on its SNR. High-SNR communication channels can transmit data quickly and accurately, while low-SNR communication channels can be plagued with errors, such as dropped messages.

Error correcting code (ECC) can provide a way to reduce errors in data storage and transmission by introducing data redundancy into the communication channel, typically in the form of extra bits that are used to check the validity of the original data. ECCs typically utilize codewords, which are specific patterns of bits or symbols in a storage medium or transmission signal, to group data into chunks to be checked for errors.

Low-density parity-check (LDPC) is a particular type of ECC. When using LDPC, original data is encoded using an LDPC code. An LDPC code can be represented mathematically as a two-dimensional matrix. An LDPC code can also be represented graphically, as a bipartite graph containing two sets of nodes (variable nodes and check nodes) connected by edges. Encoding based on an LDPC code produces a codeword, which can be decoded to produce the original data even in the presence of channel degradation and/or data corruption. LDPC decoding is an iterative process in which different nodes of the LDPC code update each other based on calculated probabilities regarding individual bits of the codeword.

SUMMARY

There is provided, in accordance with an embodiment, a method of decoding codewords in conjunction with a low-density parity-check (LDPC) code that defines variable nodes and check nodes, the method comprising receiving a codeword over a data channel; evaluating quality of the data channel; and iteratively updating values of the variable nodes to decode the codeword; wherein the values of the variable nodes are updated at different levels of numeric precision depending on the evaluated quality of the data channel.

There is also provided, in accordance with an embodiment, a decoder that decodes codewords received over a data channel in conjunction with a check code that defines variable nodes and check nodes, the decoder comprising value memory configured to store values of the variable nodes; and an update engine configured to iteratively update the stored values of the variable nodes; wherein the update engine is responsive to a quality of the data channel and configured to update the stored values of the variable nodes at different levels of numeric precision.

There is also provided, in accordance with an embodiment, a decoder that decodes codewords received over a data channel in conjunction with a check code that defines variable nodes and check nodes, the decoder being configured to perform actions comprising: evaluating a quality of the data channel; and iteratively updating values of the variable nodes to decode a received codeword; wherein the values of the variable nodes are updated at different levels of numeric precision depending on the evaluated quality of the data channel.

BRIEF DESCRIPTION OF THE DRAWINGS

Embodiments of the present disclosure will be readily understood by the following detailed description in conjunction with the accompanying drawings. To facilitate this description, like reference numerals designate like elements.

FIG. 8 is a diagram illustrating an example LDPC code matrix.

FIG. 9 (labeled as "Prior Art") illustrates processing layers of an LDPC code matrix in a conventional LDPC decoder.

FIGS. 15A and 15B illustrate example scaling of LLR values by the LLR pre-processing module of FIG. 14.

DETAILED DESCRIPTION

The following description merely provides examples and is in no way intended to limit the disclosure, its application, or uses.

Figure 1:
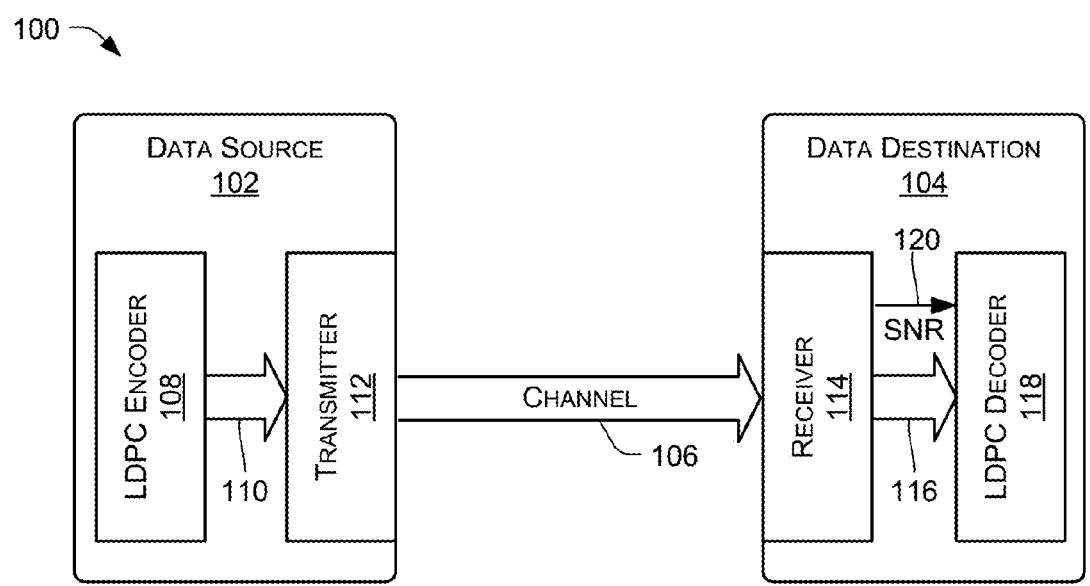
FIG. 1 is a functional block diagram of system in which data is transmitted over a data communications channel using LDPC techniques in accordance with an embodiment of the present disclosure.

FIG. 1 shows an example system 100 in which the techniques described herein may be used. The system 100 includes a data source 102 and a data destination 104, which communicate an encoded signal over a data communications medium or channel 106. The communications channel 106 may comprise a wired or wireless communications channel, and may have varying degrees of quality or reliability. In some implementations, the encoded signal may comprise data stored in a storage system such as a magnetic disk or optical disk, and the channel 106 may represent the storage system.

The data source 102 includes a low-density parity-check (LDPC) encoder 108, which may be configured to encode original data in accordance with LDPC encoding techniques, resulting in encoded LDPC data or codewords 110 that are transmitted over or stored by the communications channel 106. The data source 102 also includes a signal transmitter 112 that receives the encoded data or codewords 110 from the LDPC encoder 108 and that modulates the encoded data 110 for transmission over the communications channel 106.

The data destination 104 includes a signal receiver 114 that receives a communications signal from the communications channel 106. The signal receiver 114 demodulates the received communications signal and provides demodulated, encoded data or codewords 116 to an LDPC decoder 118. The LDPC decoder 118 decodes the encoded data 116 to reproduce the original data. LDPC decoding techniques allow faithful reproduction of the original data in spite of bit errors that are potentially introduced by degradations of the communications channel 106.

The communications channel 106 may exhibit varying degrees of reliability over time. The signal receiver 114 may evaluate the reliability of the communications channel 106 in terms of the quality of the received data signal. In the described embodiment, signal-to-noise ratio (SNR) of the received signal is used as an indicator of channel quality or reliability. The receiver 114 repeatedly or continuously evaluates the SNR of the channel 106 and provides an SNR signal, measurement, or value 120 to the LDPC decoder 118. The LDPC decoder 118 may vary certain characteristics of the LDPC decoding based on the current SNR. In particular, LPDC decoding may be performed at different levels of numeric precision, depending on the current quality or SNR of the data channel 106.

Figure 2A:
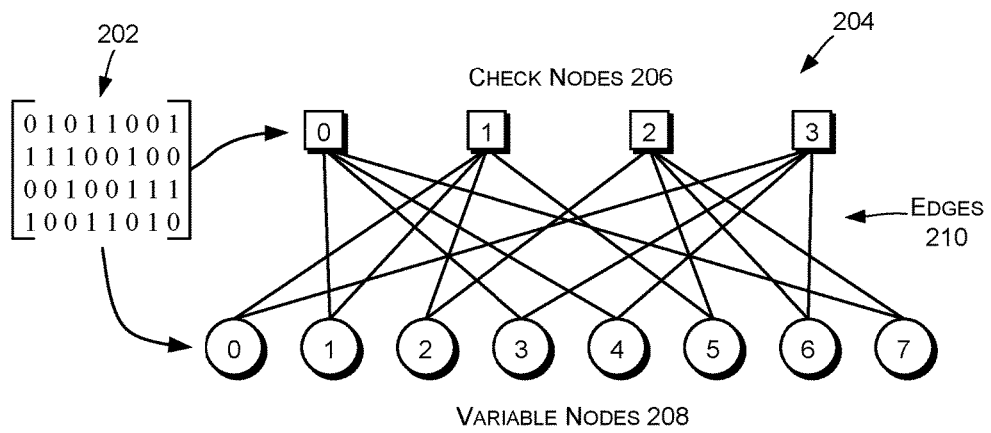
FIG. 2A is a diagram illustrating an example LDPC code.

FIG. 2A illustrates an LDPC code, represented as an LDPC code matrix 202 (also referred to as a binary parity check matrix) and as a corresponding bipartite graph 204. The LDPC code matrix 202 comprises a plurality of rows and a plurality of columns. In this example, the code matrix has four rows and eight columns. The elements of the matrix 202, each of which corresponds to a single row and a single column, are binary. Each value is thus represented as either a 0 or a 1.

The LDPC code defines a plurality of nodes, which are best illustrated by the LDPC graph 204. The LDPC graph 204 comprises a plurality check nodes 206 and variable nodes 208. The check nodes 206, labeled from 0 through 3, correspond respectively to rows 0 through 3 of the matrix 202. The variable nodes 208, labeled from 0 through 7, correspond respectively to rows 0 through 7 of the matrix 202.

Edges 210 connect each check node 206 to a number of individual variable nodes 208. The edges 210 also connect each variable node 208 to a number of individual check nodes 206. The edges 210 correspond to 1's of the matrix 202: for each 1 value at a particular row and column, an edge 210 connects between the corresponding check node 206 and variable node 208.

Decoding a codeword can be explained conceptually with reference to the graph 204. In this example, a received codeword comprises 8 bits, corresponding to the 8 variable nodes 0 through 7. In order to decode the codeword, each variable node sends a value or message to its edge-connected check nodes, indicating the "belief" of the variable node regarding its value. For example, variable node "1" sends a message to check nodes "0" and "1", which are connected by respective edges 210.

In response, each check node sends a message to its connected variable nodes, indicating the "belief" of the check node regarding the value of the check node to which the messages is sent.

Initially, an individual variable node "believes" that its value is as received by the receiver 114. Subsequently, an individual variable node may reevaluate its belief based on received values or messages from the check nodes.

An individual check node bases its belief regarding a particular variable node based on most recent values received from other variable nodes and upon parity equations that are known to have been used in the LDPC encoding process.

The "beliefs" shared between nodes may be represented in various ways, such as by values, likelihoods, probabilities, and so forth. For example, an individual belief value may be represented as the likelihood that the corresponding node is either a "0" or a "1". In some implementations, belief values may be represented as value pairs, including both the likelihood that a node value is a one and the likelihood that a node value is a zero.

The process described above iterates, with the check nodes and variable nodes exchanging messages and/or belief values, until all parity or check equations are fulfilled by the bits of the variable nodes, or until a predefined number of iterations have been performed. The final bit values of the variable nodes then indicate the decoded codeword.

Figure 2B:
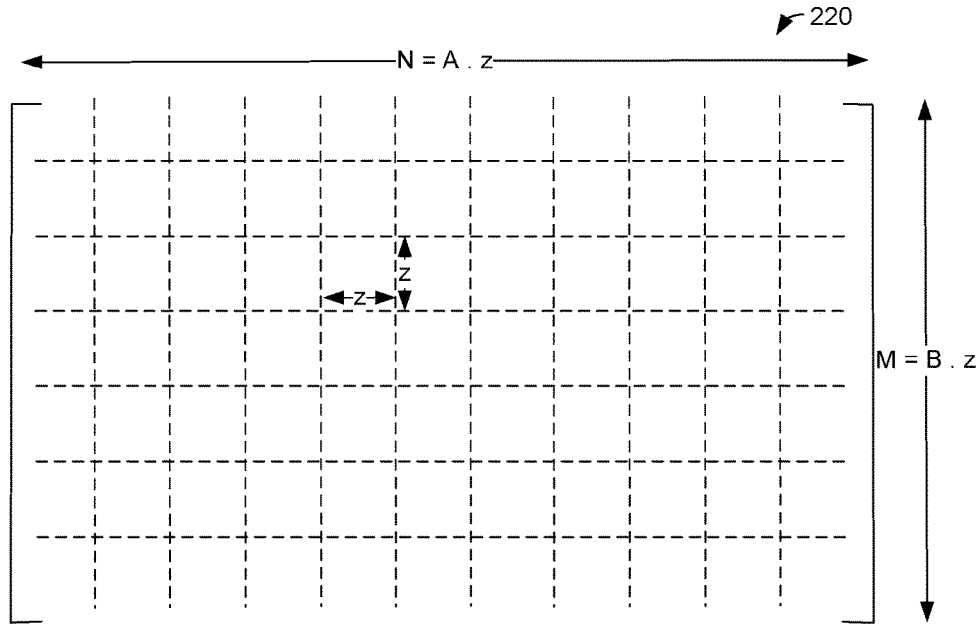
FIG. 2B is a diagram illustrating an example LDPC code matrix.

FIG. 2B illustrates an LDPC code matrix 220. The LDPC matrix 220 has a dimension of M rows and N columns, where M and N are appropriate integers. The LDPC matrix 220 is, for example, a sparse binary parity check matrix, in which each entry is 1 or 0. The LDPC matrix 220 is, for example, used to encode and/or decode K bits of data, where M≥(N−K). If the LDPC matrix 220 is represented as H, then a binary string c (which is of length N) is a codeword for the LDPC code matrix 220 if and only if H.c=$\overline{O}$, where $\overline{O}$ is a null matrix of appropriate dimensions.

The LDPC matrix 220 is divided in A by B subdivisions (illustrated using dotted lines in FIG. 2B), where A and B are appropriate integers. Each subdivision of the LDPC matrix 220 is referred to as a circulant of the LDPC matrix 220. A circulant is a square matrix of dimension z by z (i.e., each circulant has z rows and z columns), i.e., each circulant is of size z. Each circulant comprises single shifted diagonal elements of 1's, and other entries of the circulant are 0. The circulant size z can take an appropriate integer value. For example, z may be equal to one of 27, 54 or 81.

The number of columns N of the LDPC matrix 220 is given by A.z, and the number of rows M of the LDPC matrix 220 is given by B.z. As is well known to those skilled in the art, for a given length of data (i.e., for a given value of K) and for a given value of N, the LDPC matrix 220 is associated with a given code rate. For example, for 1620 bits of data (i.e., K=1620) and for N=1944, the code rate is 5/6 (i.e., for every 5 bits of data, the LDPC encoder 108 generates 6 bits of data, of which (6−5), i.e., 1 bit data is redundant.

In an example, the code rate associated with the LDPC matrix 220 can take one of various possible values, e.g., 5/6, 3/4, 2/3, 1/2, or the like. Also, in an example, the circulant z can take an appropriate integer value, e.g., 27, 54 or 81. Thus, in an example, if the code rate can take one of four possible values and the circulant z can take one of three possible values, then the structure of the LDPC matrix 220 can take one of 12 possible values (i.e., one structure for each possible value of the code rate and for each possible value of the circulant z).

Figure 3:
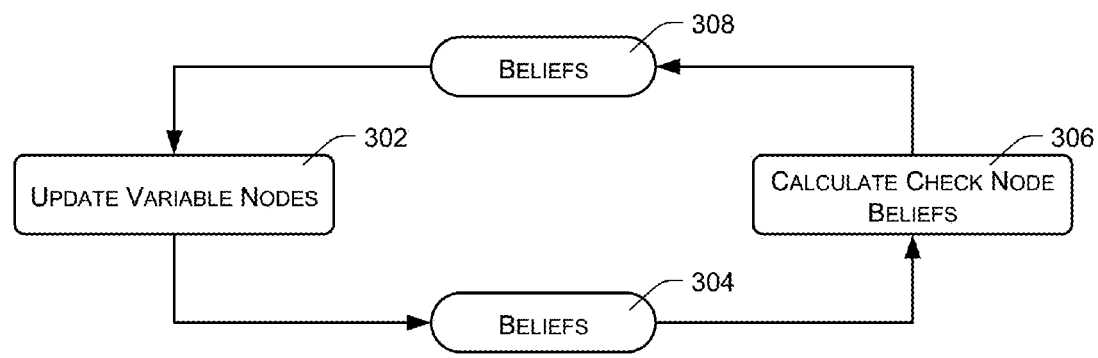
FIG. 3 is a flowchart illustrating high-level aspects of decoding a codeword based on an LDPC code.

FIG. 3 illustrates an overview of a iterative decoding process in the form of a high-level flowchart. The process begins at 302, which comprises updating values of the variable nodes 208. Initially, each variable node 208 is assigned the corresponding bit of the received codeword, which may contain errors. At 304, the assigned values form variable node beliefs. At 306, the assigned values form variable node beliefs are used as input for calculating or recalculating beliefs 308 of the check nodes 206 regarding the variable nodes 208, based on the variable node beliefs 304 and upon parity check equations. At 308, the calculated check node beliefs are used as input in another iteration of 302, in which the values of the variable nodes 208 are updated based on the check node beliefs calculated at 306. This process iterates or repeats until it converges, or until a set limit of iterations has been performed, upon which the updated values of the variable nodes 208 are declared as the correct and/or corrected value of the received codeword.

The algorithm used to implement the general LDPC decoding process described above may be referred to as the "belief propagation algorithm," the "message passing algorithm," and/or the "sum-product algorithm." The beliefs 304 and 308 may be represented in different ways, such as absolute values, probabilities, likelihoods, and so forth. In some cases, the beliefs 304 and 308 may be calculated and represented in logarithmic space in order to simplify calculations.

In certain LDPC implementations, the beliefs 304 and 308 may be calculated and represented as a-posteriori probability (APP) values, which may in turn be calculated and represented in the logarithmic domain as log likelihood ratios (LLRs).

Figure 4:
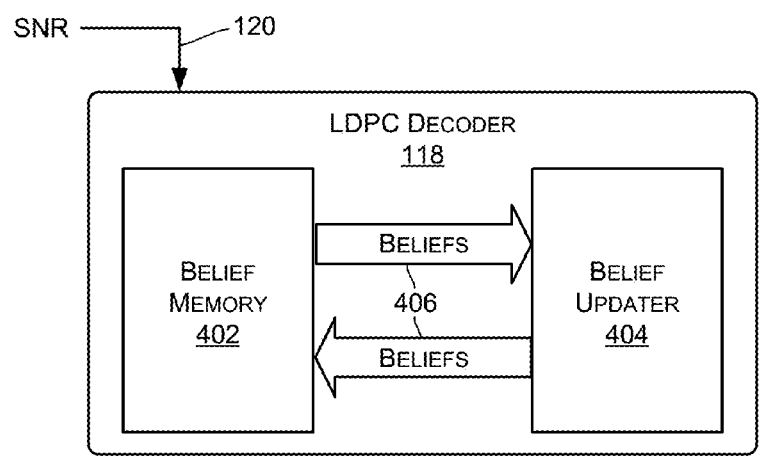
FIG. 4 is a high-level block diagram illustrating functional components of an LDPC decoder in accordance with an embodiment of the present disclosure.

FIG. 4 illustrates example components of an LDPC decoder 118 that may be used to implement the LDPC decoding process of FIG. 3. In this example, the LDPC decoder 118 comprises a belief memory or value memory 402 and a belief updater, value updater, or update engine 404. The belief memory 402 comprises memory registers or locations corresponding to the check nodes 206 and the variable nodes 208, which are used for storing calculated beliefs or belief values 304 and 308.

The belief updater 404 comprises a processor or other logic for performing the updating and calculations of FIG. 3. Accordingly, the belief updater 404 writes and reads belief values 406 to and from the registers or locations of the belief memory 402. The belief values 406, which may be equivalent to the beliefs 304 and 308 of FIG. 3, may be represented as numeric values within the belief memory 402, such as by APP values or LLR values.

In various embodiments, the belief memory 402 may be referred to as APP memory. Similarly, the belief updater 404 may be referred to as an APP engine or updater.

Reconfigurable Precision of LDPC Decoder Processing

In an embodiment, the LDPC decoder 118 is responsive to the signal-to-noise ratio (SNR) of the communications channel 106 (FIG. 1), as represented by the SNR signal 120, to dynamically vary the level of numeric precision at which the belief values 406 are calculated and stored during the LDPC decoding process. For example, a relatively high precision may be used when the data channel 106 exhibits a low signal quality or SNR, and a relatively low precision may be used when the data channel 106 exhibits a high signal quality or SNR.

Figure 5:
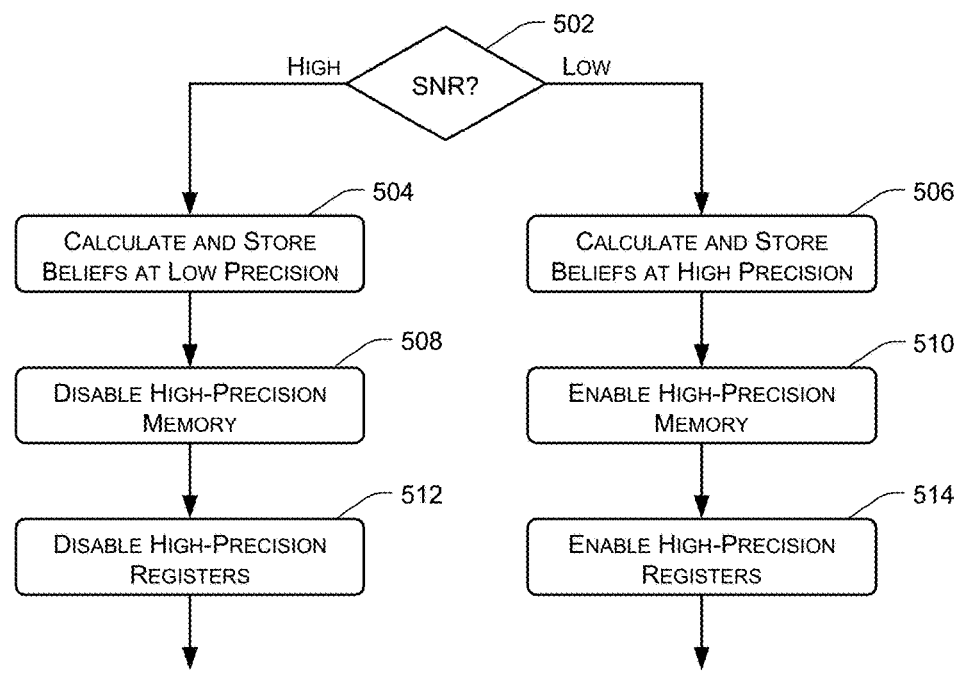
FIG. 5 is a flowchart illustrating further aspects of decoding a codeword based on an LDPC code, including power conservation techniques that may be employed in certain situations.

FIG. 5 illustrates the behavior of the LDPC decoder 118 with respect to the use of varying levels of numeric precision when calculating LDPC beliefs of belief values. At 502, a quality of the data communications channel is evaluated, in terms of an SNR value 120. If the current SNR is relatively high, such as being greater than a predetermined threshold, the decoder 118 performs its calculations in accordance with the actions on the left side of FIG. 5. If the current SNR is relatively low, such as being less than a predetermined threshold, the decoder performs its calculations in accordance with the actions on the right side of FIG. 5.

In the case where the current SNR is above the predetermined threshold, at 504, check node and variable node beliefs are calculated, provided, sent, and/or stored at a relatively low level of numeric precision. For example, belief values may be represented in calculations and stored in the memory 402 using 6 bits of precision. At 508, a high-precision memory (e.g., a portion of a memory for storing check node and variable node beliefs at a relatively high level of numeric precision) is disabled. At 512, one or more high-precision registers (e.g., for storing check node and variable node beliefs at a relatively high level of numeric precision) are disabled.

In the case where the current SNR is below the predetermined threshold, at 506, check node and variable node belief values are calculated and stored at relatively high levels of precision. For example, belief values may be represented in calculations and in the belief memory 402 at 8 bits of precision.

The decreased precision when the data channel is exhibiting a high SNR allows for implementation of various power-saving techniques. For example, at 508, when the SNR is relatively high, the portion of the belief memory 402 that is otherwise used for storage of low-order, high-precision bits of belief values is disabled. When the data channel is exhibiting a low SNR, at 510, this portion of memory is enabled. Also, at 514, the one or more high-precision registers (e.g., for storing check node and variable node beliefs at a relatively high level of numeric precision) are enabled.

Figure 6:
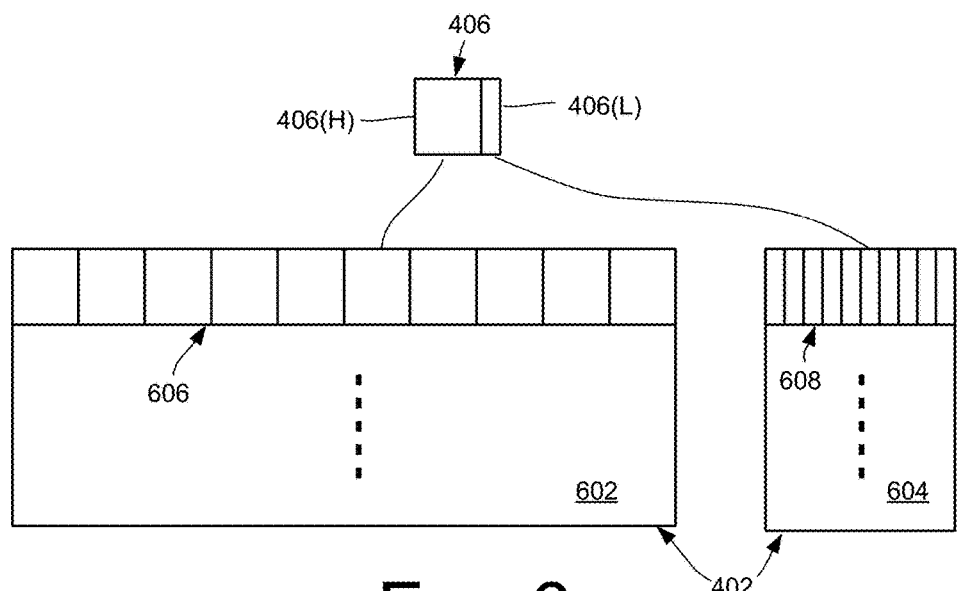
FIG. 6 is a block diagram illustrating an example memory configuration that may be used for power conservation in conjunction with the techniques described herein.

FIG. 6 illustrates an example configuration of the belief memory 402, in which a portion of the memory may be disabled for power savings in situations where the data channel 106 exhibits a high SNR. The belief memory 402 comprises two memory arrays or areas 602 and 604, which may be implemented using different portions of a semiconductor die. The first memory or memory area 602 may be used for storing low-precision portions of belief values 406, such as higher-order bits or most significant bits of the belief values 406. The second memory or memory area 604 may be used for storing high-precision portions of the belief values 406, such as lower-order bits or least significant bits of the belief values 406.

An example of a belief value 406 is illustrated in FIG. 6 as having high-order bits 406(H), corresponding to a low-precision portion of the belief value 406. The belief value also has lower-order bits 406(L), corresponding to a high-precision portion of the belief value 406. For example, the high-order, low-precision bits 406(H) may comprise the upper or most significant 6 bits of the belief value 406, and the low-order, high-precision bits 406(L) may comprise the lower or least significant 2 bits of the belief value 406.

The high-order bits 406(H) of a single belief value 406 may be stored in one of a plurality of registers 606 of the first memory area 602, and the low-order bits 406(L) of the belief value 406 may be stored in a corresponding one of a plurality of registers 608 of the second memory area 604. When reading a belief value 406 from the belief memory 402, corresponding registers 606 and 608 are concatenated to form the full-precision belief value 406.

When the LDPC decoder 118 is acting in a low-precision mode, corresponding to the left side of FIG. 5, the high-precision portion 604 of the belief memory 402 may be disabled to conserve power. In this case, the LDPC decoder 118 references only the first memory area 602, and uses belief values that comprise only the high-order bits 406(H) of the belief values 406.

As another example of a power-saving technique under conditions of high SNR, an action 512 may be performed, comprising disabling various logic circuits of the belief updater 404 that are responsible calculating or otherwise handling high-precision portions of the belief values. When the data channel 106 is exhibiting a low SNR, an action 514 may be performed of enabling these logic elements or components.

Figure 7:
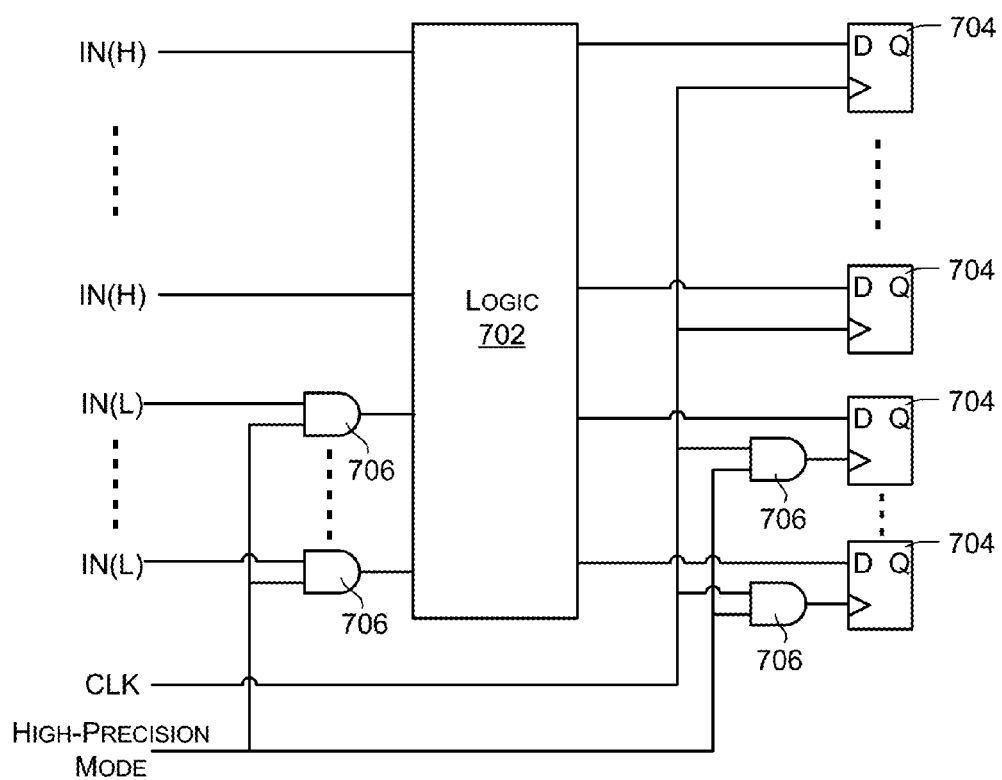
FIG. 7 is a block diagram illustrating example component configuration that may be used for power conservation in conjunction with the techniques described herein.

FIG. 7 illustrates an example configuration of components within the belief updater 404, in which the clock signal to certain portions of the logic corresponding to high-precision calculations may be gated or disabled. Logic 702 is responsible for performing the calculations and data transfers described above. In addition, various registers and/or latches 704 may be used for transmitting and temporarily storing certain data within the belief updater 404.

The logic 702 generally responds to input signals, including high-order input signals labeled IN(H) and low-order input signals labeled IN(L). As described above, the low-order input signals IN(L) may be disregarded when the belief updater 404 is not operating in a high-precision mode. Similarly, registers and/or latches 704 corresponding to the low-order input signals IN(L) may be unused when the belief updater 404 is not operating in the high-precision mode.

The logic 702 and registers 704 are clocked by one or more clock signals, represented in FIG. 7 by a signal labeled CLK. In an embodiment, the clock signal CLK is gated by one or more AND gates 706 before being used to clock low-order elements of the updater 414. The AND gates 706 have inputs connected to the CLK signal and to a high-precision mode signal, labeled in FIG. 7 as HIGH-PRECISION MODE. Accordingly, the CLK signal is enabled at the low-order elements of the updater 414 only when the LDPC decoder 118 is operating in the low-precision mode.

The techniques described above may be used for power conservation in various situations in which data is received over a channel of variable quality, such as wireless communications channels.

Note that although the description above assumes two levels of numeric precision, other embodiments may use three or more levels of precision, corresponding to different ranges of SNR.

Reconfigurable Processing by LDPC Decoder

FIG. 8 is a diagram illustrating an example LDPC code matrix 800 (henceforth referred to as "matrix 800"). The matrix 800 is, for example, a sparse binary parity check matrix, in which each entry is 1 or 0. The matrix 800 is divided in a plurality of subdivisions, each subdivision corresponding to a circulant. Some of the example circulants of the matrix 800 is illustrated in FIG. 8. For example, example circulants S00, S01, . . . , S05, S10, . . . , S15, S20, . . . , S24 are illustrated in FIG. 8. Although a given number of circulants are illustrated in FIG. 8, the matrix 800 may include any different number of circulants. Some of the circulants of the matrix 800 are illustrated as by a dash sign ("-"), for example, as these circulants have all zero entries, are not relevant for processing the matrix 800, are merely for illustrative purposes, and/or the like.

Each circulant of the matrix 800 comprises shifted diagonal elements of 1's, and other entries of the circulant are 0. Each of the circulants is a square matrix with z rows and z columns (i.e., the circulant size is z), where z can take an appropriate integer value. For example, z may be equal to one of 27, 54 or 81.

In an embodiment, a layer of the matrix 800 refers to a row of the circulants of the matrix 800. For example, a first layer (or layer 0) of the matrix 800 comprises circulants S00, S01, . . . , S05, and second layer (or layer 1) of the matrix 800 comprises circulants S10, . . . , S15, and so on. Although the example matrix 800 illustrates only three layers, in another embodiment, the matrix 800 can include any other appropriate number of layers.

In an embodiment, a circulant of the matrix 800 can be read from the belief memory 402 during a single clock cycle, and a circulant of the matrix 800 can be updated by the belief updater 404 during a single clock cycle. For example, all the circulants of layer 0 of the matrix 800 (i.e., circulants S00, . . . , S05) are read from the belief memory 402 during consecutive clock cycles (e.g., during six consecutive clock cycles). It takes, for example, three clock cycles (or any other appropriate number of clock cycles) to decode or update the circulants of layer 0 of the matrix 800 (e.g., by the belief updater 404). Subsequently, the updated circulants of layer 0 of the matrix 800 are written back to the belief memory 402. This iterative process continues for individual layers until the decoding process is successfully completed.

FIG. 9 (labeled as "Prior Art") illustrates processing layers of an LDPC code matrix (e.g., matrix 800) in a conventional LDPC decoder. In FIG. 9, during six consecutive clock cycles (labeled as clock cycles 0, . . . , 6), circulants S00, . . . , S05 of layer 0 are read from a belief memory. It takes, for example, three clock cycles to decode and update the circulants (e.g., by a belief updater). Subsequently, the circulants S00, . . . , S05 of layer 0 are written to the belief memory during clock cycles 9, . . . , 14.

The circulant S10 of layer 1 can be read from the belief memory only after, for example, the circulant S00 is written back to the belief memory. This is to avoid, for example, "read-before-write" conflict in the circulant column of the LDPC code matrix 800. Accordingly, as illustrated in FIG. 9, the circulant S10 is read at clock cycle 10. Thus, the start of reading of the circulants of layer 1 can begin only at clock cycle 10. Thus, for four clock cycles (i.e., clock cycles 6 to 10), no read operation is performed in the belief memory, resulting in idle time in the read operation. Such idle time results in a delay in decoding codewords in a conventional LDPC decoder.

Figure 10:
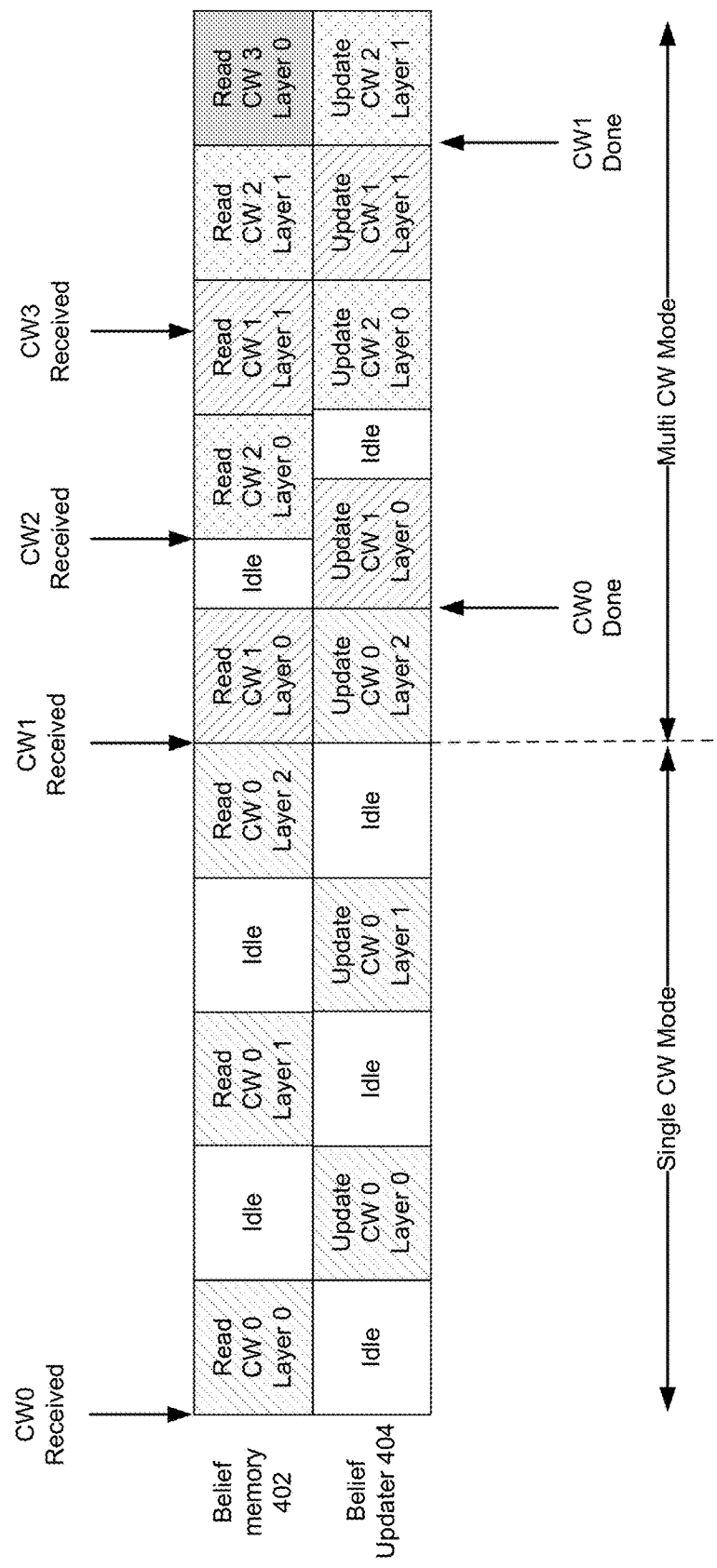
FIG. 10 illustrates parallel decoding of a plurality of LDPC codewords.

FIG. 10 illustrates parallel decoding of a plurality of LDPC codewords. The decoding of the plurality of LDPC codewords, as illustrated in FIG. 10, can be performed by an LDPC decoder, e.g., the LDPC decoder 118 of FIG. 1 (comprising the belief memory 402 and the belief updater 404). Referring to FIGS. 4, 8 and 10, after a first codeword (CW), e.g., CW 0 is received, a layer 0 of the associated LDPC code matrix of the CW 0 is read from the belief memory 402. Subsequent to reading the layer 0 of CW 0, the belief updater 404 updates and writes back the updated values of the layer 0 of CW 0 to the belief memory 402. Subsequently, the layer 1 of the CW 0 is read from the belief memory 402, and the iterative process of reading, updating and writing the layers of CW 0 continues. It is to be noted that although FIG. 10 illustrates each layer of a CW being read and updated only once, a layer of a CW can be read and updated multiple times iteratively, based on a requirement of the LDPC decoding process.

When the LDPC decoder 118 decodes only a single codeword (e.g., CW 0), the LDPC decoder 118 operates in a single CW mode, as illustrated in FIG. 10. For reasons discussed with respect to FIG. 9, during the single CW mode, the belief memory 402 and/or the belief updater 404 frequently remains idle, as illustrated in FIG. 10.

In an embodiment, subsequent to receiving and while processing the CW 0, the LDPC decoder 118 receives a second codeword, e.g., CW 1, as illustrated in FIG. 10. In an embodiment, the LDPC decoder 118 starts processing the CW1 immediately after receiving the CW1, even while processing the CW 0. For example, while the layer 2 of the CW0 is being updated (e.g., by the belief updater 404), the layer 0 of the CW 1 is read from the belief memory 402. In another example, immediately after the layer 2 of the CW 0 is updated, the layer 0 of the CW 1 is updated by the belief updater 404, thereby eliminating any idle time of the belief updater 404 between updating the two layers of the two codewords.

In an embodiment, subsequent to receiving and while processing the CW 1, the LDPC decoder 118 receives another codeword CW 2, as illustrated in FIG. 10. The LDPC decoder 118 decodes the CW1 and CW2 at least in part in parallel, e.g., while a layer of the CW 1 is being read from the belief memory 402, a layer of the CW 2 is updated by the belief updater 404. In an embodiment, subsequent to receiving and while processing CW 1 and CW2, the LDPC decoder 118 receives yet another codeword CW 3, as illustrated in FIG. 10. The LDPC decoder 118 processed, at least in part, the CW1, CW2 and CW3 in parallel, as illustrated in FIG. 10, thereby further reducing the idle time of the belief memory 402 and/or the belief updater 404.

In an embodiment, while the LDPC decoder 118 processes at least two codewords in parallel, the LDPC decoder 118 operates in a multi CW mode. As discussed, while operating in the multi CW mode, the idle time of the belief memory 402 and/or the belief updater 404 is reduced (e.g., compared to that in the single CW mode).

In an embodiment, while the belief memory 402 and/or the belief updater 404 are idle (e.g., either in the single CW mode or the multi CW mode), the belief memory 402 and/or the belief updater 404 are at least partially shut down (e.g., operates in a low power or sleep mode).

Figure 11:
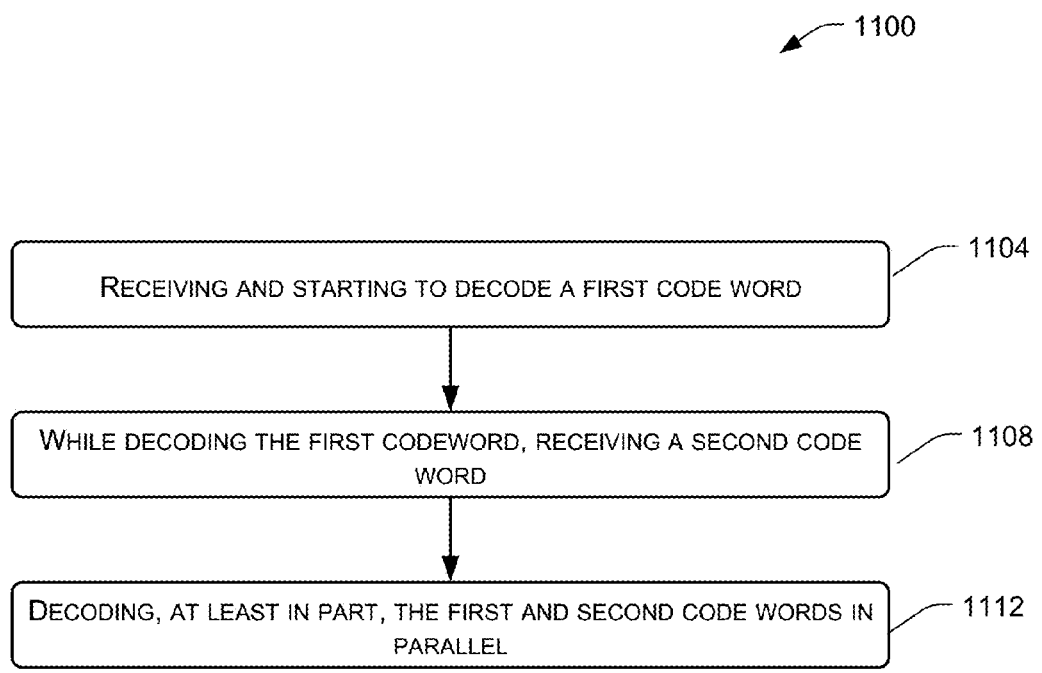
FIG. 11 is a flowchart illustrating decoding, at least in part, at least two codewords in parallel.

FIG. 11 is a flowchart 1100 illustrating decoding, at least in part, at least two codewords in parallel. At 1104, an LDPC decoder (e.g., the LDPC decoder 118) receives and starts processing a first codeword (e.g., the CW 0 of FIG. 10). Processing the first codeword comprises iteratively reading a layer of the first codeword from a belief memory (e.g., belief memory 402), updating the layer of the first codeword by a belief updater (e.g., belief updater 404), and/or writing back the updated layer of the first codeword to the belief memory, and repeating the process for the layer or another layer of the first codeword.

At 1104, while decoding the first codeword, a second codeword (e.g., CW 1) is received by the LDPC decoder. At 1108, the LDPC decoder processes, at least in part, the first codeword and the second codeword in parallel, e.g., as discussed with respect to FIG. 10.

Reconfigurable Circulant Shifter

In an embodiment and as previously discussed, each circulant of an LDPC code matrix (e.g., the LDPC code matrix 800 of FIG. 8) is a square matrix of z rows and z columns, where z is an appropriate integer. For example, z can take a value of one of 27, 54 and 81, e.g., based on an application area of the LDPC decoder 118, an intended redundancy of the LDPC encoding, an intended code rate, a size of the data to be encoded and decoded, and/or the like. In order to decode a codeword, the elements of the circulants may need to be shifted diagonally. A number of times a circulant need to be shifted and an amount by which the circulant needs to be shifted are based on, for example, the decoding of the codeword.

In a conventional LDPC decoder that support circulant sizes of, for example, 27, 54 and 81, separate sets of multiplexers are used for each circulant size to shift the elements of the circulants. For example, in the conventional LDPC decoder, if a circulant size is z, then at least $z \cdot \log(z)$ number of multiplexers is needed to shift the circulants. For example, for shifting a circulant of size 81, at least 81×7, i.e., 567 multiplexers are needed. Accordingly, for a conventional LDPC decoder that supports circulant sizes of 27, 54 and 81, a total of (27×5)+(54×6)+(81×7), i.e., 1026 multiplexers are necessary to support shifting circulants of sizes 27, 54 and 81. Such a large number of multiplexers consume considerable circuit area, and signal routing for such a large number of multiplexers can be relatively complex.

Figure 12A:
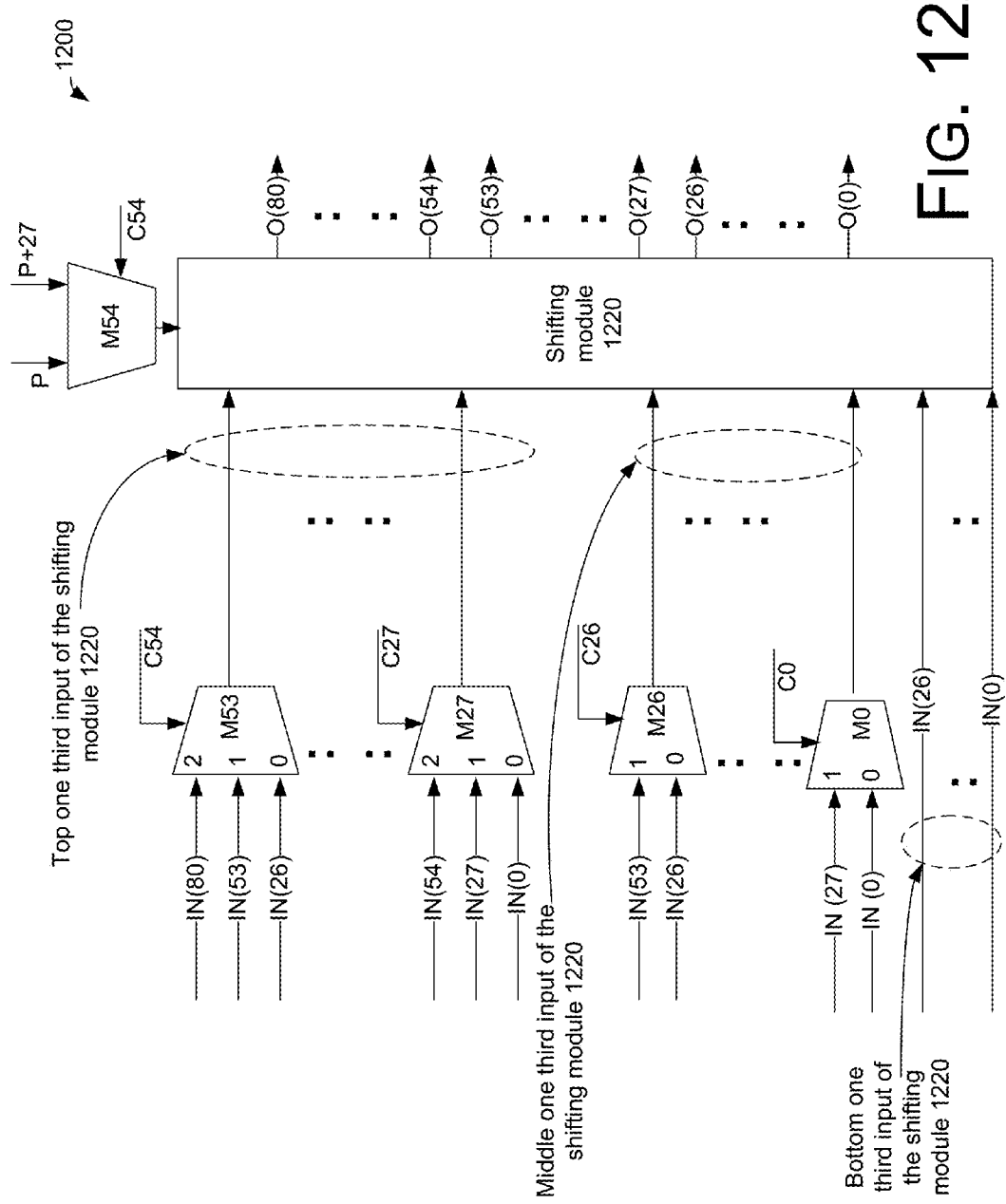
FIG. 12A illustrates a circuit that support shifting circulant of varying sizes.

FIG. 12A illustrates a circuit 1200 that supports shifting circulant of varying sizes. In an embodiment, the circuit 1200 is configured to shift the elements of the circulants of, for example, the LDPC code matrix 800 of FIG. 1. In an embodiment, the circuit 1200 supports circulants of sizes 27, 54 and 81 (e.g., as circulants of these sizes are commonly used for LDPC encoding and decoding). However, the circuit 1200 can be modified to support circulants of any other appropriate sizes, as will be readily understood by those skilled in the art based on the teachings of this disclosure.

The circuit 1200 comprises 55 multiplexers, labeled as M0, . . . , M54, each controlled by respective control signals C0, . . . , C54. In an embodiment, each of the multiplexers M0, . . . , M26 and M54 are configured to receive two inputs, and selectively output one of the two inputs, e.g., based on the corresponding control signal. In an embodiment, each of the multiplexers M27, . . . , M53 is configured to receive three inputs, and selectively output one of the three inputs, e.g., based on the corresponding control signal.

The circuit 1200 also comprises a shifting module 1220. In an embodiment, the shifting module 1220 is a barrel shifter configured to shift the input values by an appropriate number. Although not illustrated in FIG. 12A, the shifting module 1220 comprises 81 multiplexers, and is configured to shift 81 inputs by a maximum of 81 numbers.

As discussed, the circuit 1200 supports circulant sizes of 27, 54 and 81. For example, when shifting elements of a circulant of size 27, the circuit 1200 receives 27 inputs, labeled as IN(0), . . . , IN(26) in FIG. 12A. When shifting elements of a circulant of size 54, the circuit 1200 receives 54 inputs, labeled as IN(0), . . . IN(53) in FIG. 12A. Similarly, when shifting elements of a circulant of size 81, the circuit 1200 receives 81 inputs, labeled as IN(0), . . . , IN(80) in FIG. 12A. Thus, when shifting elements of the circulant of size 27, the inputs IN(27), . . . , IN(80) are null or invalid inputs. Similarly, when shifting elements of the circulant of size 54, the inputs IN(54), . . . , IN(80) are null or invalid inputs.

The inputs IN(0), . . . , IN(80) are logically grouped in three groups—a first input group comprising inputs IN(0), . . . , IN(26); a second input group comprising inputs IN(27), . . . , IN(53); and a third input group comprising inputs IN(54), . . . , IN(80).

In an embodiment, the shifting module 1220 receives inputs IN(0), . . . , IN(26). In an embodiment, each of the multiplexers M0, . . . , M26 is configured to receive (i) a corresponding input from the first input group and (ii) a corresponding input from the second input group. For example, the multiplexer M0 is configured to receive (i) input IN(0) from the first input group and (ii) IN(27) from the second input group; the multiplexer M1 is configured to receive (i) input IN(1) from the first input group and (ii) IN(28) from the second input group; the multiplexer M26 is configured to receive (i) input IN(26) from the first input group and (ii) IN(53) from the second input group, and so on.

In an embodiment, each of the multiplexers M27, . . . , M54 is configured to receive (i) a corresponding input from the first input group, (ii) a corresponding input from the second input group, and (iii) a corresponding input from the third input group. For example, the multiplexer M27 is configured to receive (i) input IN(0) from the first input group, (ii) IN(27) from the second input group, and (iii) IN(54) from the third input group; the multiplexer M28 is configured to receive (i) input IN(1) from the first input group, (ii) IN(28) from the second input group, and (iii) IN(55) from the third input group; the multiplexer M53 is configured to receive (i) input IN(26) from the first input group, (ii) IN(53) from the second input group, and (iii) IN(80) from the third input group, so on.

In an embodiment, the inputs of the shifting module 1220 is divided in three groups: a top one third input of the shifting module 1220 (e.g., comprising outputs of the multiplexers M27, . . . , M53); a middle one third input of the shifting module 1220 (e.g., comprising outputs of the multiplexers M0, . . . , M26); and a bottom one third input of the shifting module 1220 (e.g., comprising inputs IN(0), . . . , IN(26) of the first input group), as illustrated in FIG. 12A. The phrases "top," "middle" and "bottom" are merely for purposes of identifying the three groups of input of the shifting module 1220, and does not indicate the actual physical locations of various inputs of the shifting module 1220.

In an embodiment, the multiplexer M55 receives an input of P and another input of (P+27), where P represents a number by which a circulant is to be shifted by the circuit 1200. P can be for example, between 0 and 26, e.g., when the circulant size is 27; between 0 and 53, e.g., when the circulant size is 54; and between 0 and 80, e.g., when the circulant size is 81.

Figure 12B:
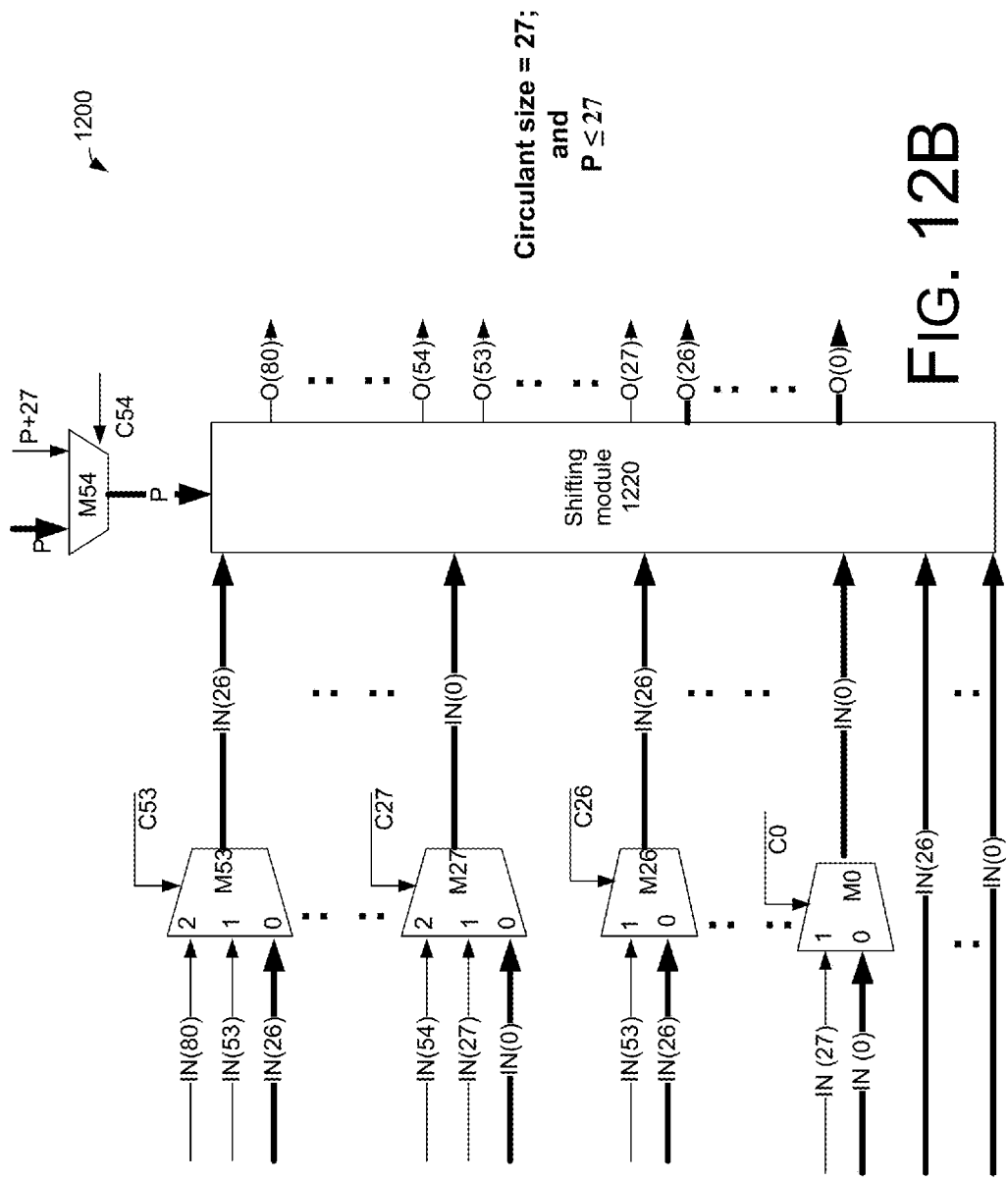
FIGS. 12B-12E illustrates example operations of the circuit of FIG. 12A.

FIG. 12B illustrates an example operation of the circuit 1200 of FIG. 12A. In the example of FIG. 12B, the circulant size is assumed to be 27. FIG. 12B illustrates the circuit 1200 of FIG. 12A; however, some of the signal lines in FIG. 12B are illustrated using relatively thicker lines. The ticker signal lines in FIG. 12B represent those signal lines which are relevant for the operation of the circuit 1220 for the example of FIG. 12B, as is discussed herein below.

In FIG. 12B, the circulant size is 27. Thus, the first input group (i.e., inputs IN(0), IN(26)) represents valid inputs of a circulant, while inputs of the second and third input groups (i.e., inputs IN(27), . . . , IN(80)) are null or irrelevant inputs in FIG. 12B. Accordingly, inputs of the first input group are illustrated using thicker lines in FIG. 12B, while inputs of the second and third input group are illustrated using thinner lines.

In the example of FIG. 12B, as the circulant size is 27, only the first 27 inputs IN(0), . . . , IN(26) are to be shifted by the shifting module 1220 (e.g., are of relevance to the shifting module 1220). Thus, the shifting module 1220 receives inputs of the first input group (i.e., inputs IN(0), . . . , IN(26)). Furthermore, the multiplexers M0, . . . , M53 needs to output data to the shifting module 1220, for the shifting module 1220 to work properly. Accordingly, in the example of FIG. 12, the multiplexers M0, . . . , M53 outputs respective input from the first input group. For example, the multiplexers M0, . . . , M26 outputs IN(0), . . . , IN(26), respectively; and the multiplexers M27, . . . , M53 also outputs IN(0), . . . , IN(26), respectively, as illustrated in FIG. 12B. That is, inputs of the first input group is replicated and transmitted to the shifting module 1220 in three parallel sets.

The shifting module 1220 shifts the received inputs by, for example, P, where P is an appropriate integer and P≥27. The shifting module 1220 outputs output O(0), . . . , O(80), based on shifting the received inputs. As the circulant size in FIG. 12B is 27, only outputs O(0), . . . , O(26) are considered, and the remaining outputs O(27), . . . , O(80) are discarded or not considered for further processing.

Figure 12C:
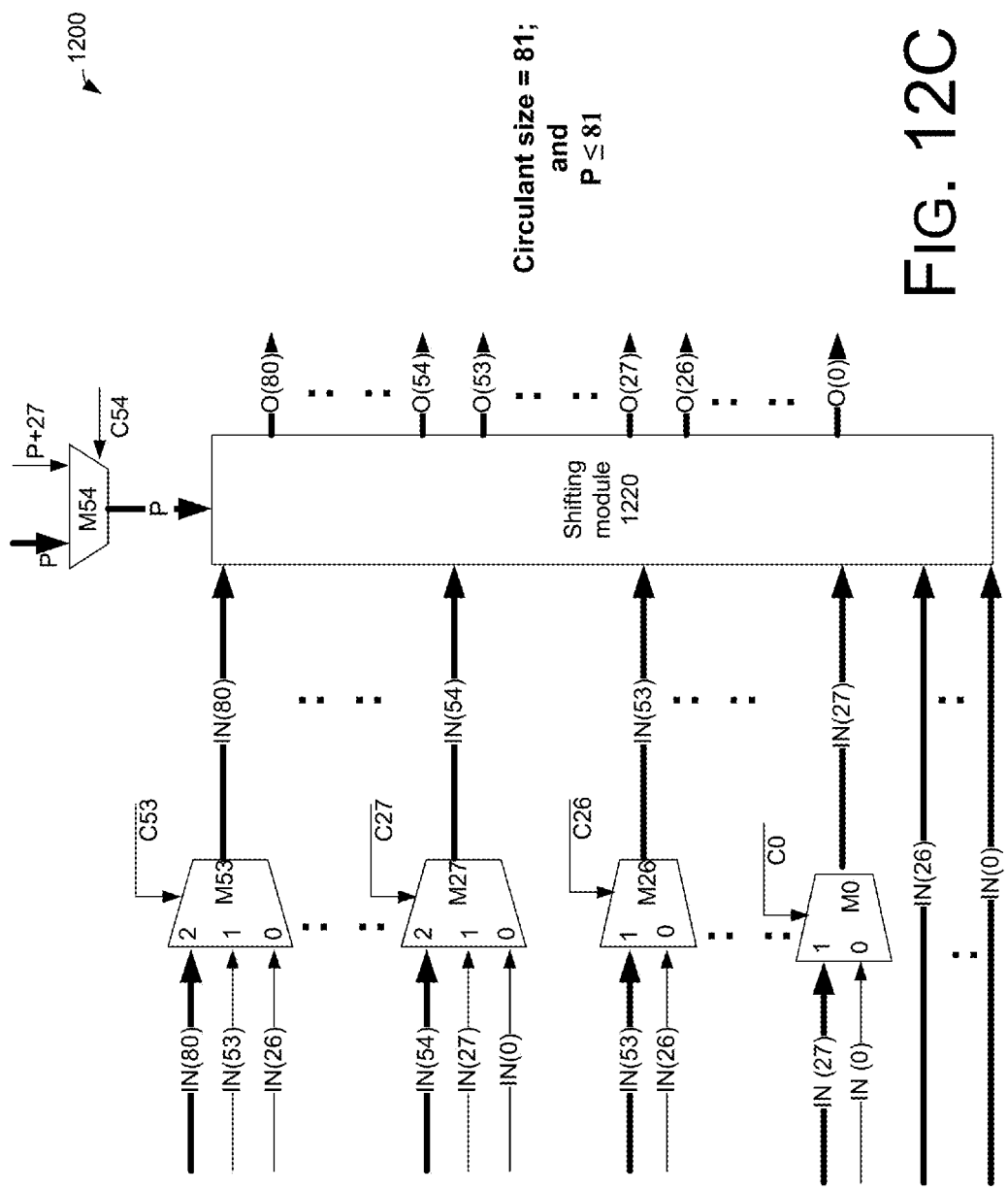

FIG. 12C illustrates another example operation of the circuit 1200 of FIG. 12A. In the example of FIG. 12C, the circulant size is assumed to be 81. FIG. 12C illustrates the circuit 1200 of FIG. 12A; however, some of the signal lines in FIG. 12C are illustrated using relatively thicker lines. The ticker signal lines in FIG. 12C represent those signal lines which are relevant for the operation of the circuit 1220 for the example of FIG. 12C, as is discussed herein below.

In FIG. 12C, the circulant size is 81. Thus, inputs of the first, second and third input groups (i.e., inputs IN(0), . . . , IN(80)) represent valid inputs of the circuit 1200. Thus, the shifting module 1220 has to receive inputs of all the three input groups (i.e., inputs IN(0), . . . , IN(80)), and shift the inputs based on the number of shifts P (in FIG. 12C, P≥81).

The shifting module 1220 receives the inputs of the first input group directly, i.e., by bypassing the multiplexers, as illustrated using the thicker lines in FIG. 12C. The multiplexers M0, . . . , M26 selectively outputs respective inputs of the second input group (i.e., inputs IN(27), . . . , IN(53)); and the multiplexers M27, . . . , M53 selectively outputs respective inputs of the third input group (i.e., inputs IN(54), . . . , IN(80)). For example, the multiplexer M0 outputs input IN(27); the multiplexer M1 outputs input IN(28); the multiplexer M26 outputs input IN(53); the multiplexer M27 outputs input IN(54); the multiplexer M53 outputs input IN(80); and so on, as illustrated in FIG. 12C.

Thus, the shifting module 1220 receives inputs IN(0), IN(80), i.e., inputs from all the three input groups. The shifting module 1220 shifts the received inputs by P, and outputs output O(0), . . . , O(80), based on shifting the received inputs. As the circulant size in FIG. 12C is 81, all of the outputs O(0), . . . , O(26) are considered for further processing.

Figure 12D:
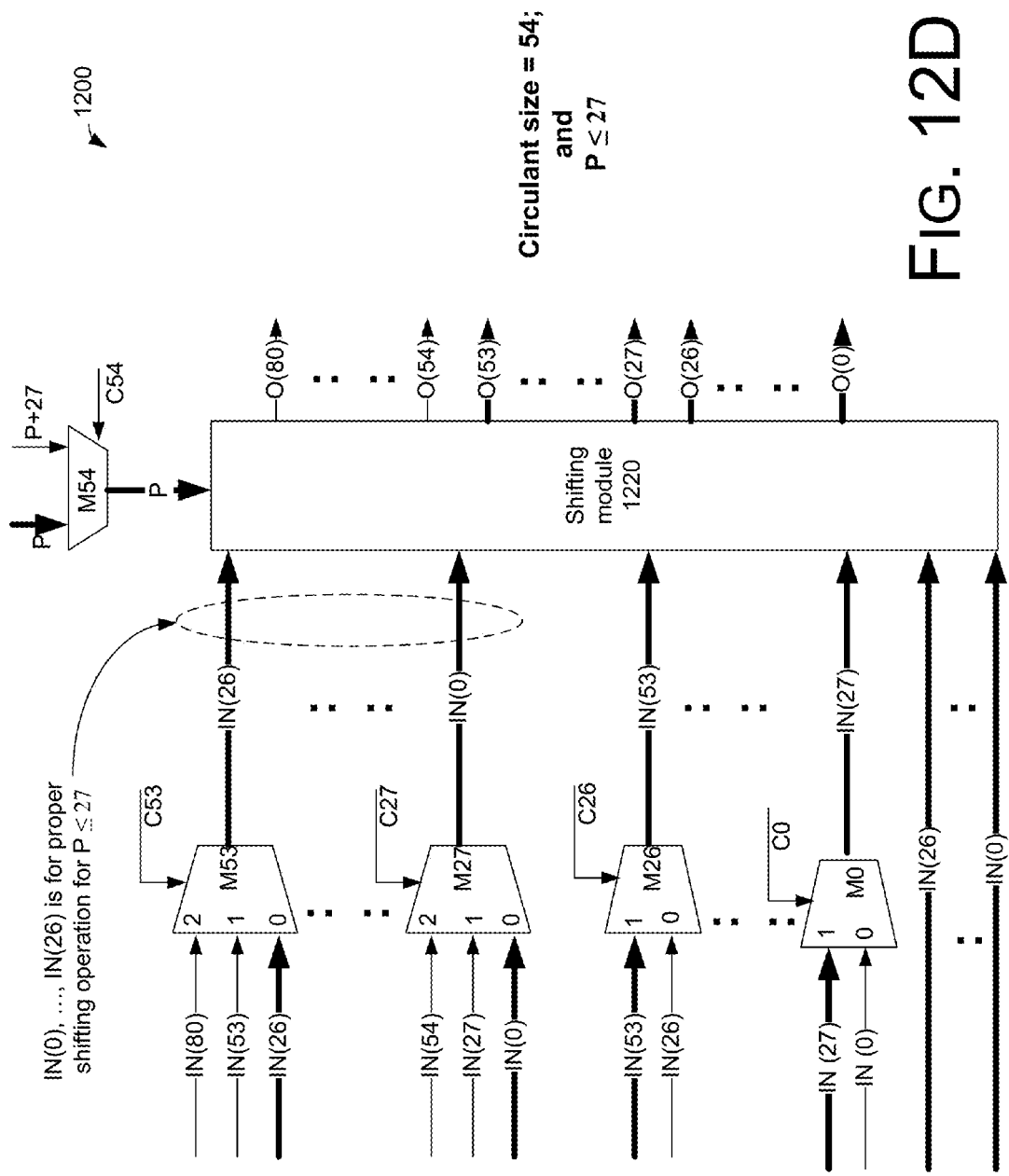

FIG. 12D illustrates another example operation of the circuit 1200 of FIG. 12A. In the example of FIG. 12D, the circulant size is assumed to be 54, and the number P by which the elements of the circulants are to be shifted is assumed to be less than or equal to 27 (i.e., P≥27). FIG. 12D illustrates the circuit 1200 of FIG. 12A; however, some of the signal lines in FIG. 12D are illustrated using relatively thicker lines. The ticker signal lines in FIG. 12D represent those signal lines which are relevant for the operation of the circuit 1220 for the example of FIG. 12D, as is discussed herein below.

In FIG. 12D, the circulant size is 54. Thus, inputs of the first and second input groups (i.e., inputs IN(0), . . . , IN(53)) represent valid inputs of the circuit 1200, while inputs of the third input group (i.e., inputs IN(54), . . . , IN(80)) are null or irrelevant inputs. Also, as the circulant size is 54, the shifting module 1220 has to receive inputs of the first and second input groups (i.e., inputs IN(0), . . . , IN(53)), and shift the inputs based on the number of shifts P (in FIG. 12D, P≥27). Accordingly, the shifting module 1220 receives the inputs of the first input group directly, i.e., by bypassing the multiplexers, as illustrated using the thicker lines in FIG. 12D. The multiplexers M0, . . . , M26 selectively outputs respective inputs of the second input group (i.e., inputs IN(27), . . . , IN(53)). For example, the multiplexer M0 outputs input IN(27); the multiplexer M1 outputs input IN(28); the multiplexer M26 outputs input IN(53); and so on, as illustrated in FIG. 12D. Thus, the shifting module 1220 receives the inputs of the second input group via the multiplexers M0, . . . , M26.

Furthermore, as P≥27, the top one third input of the shifting module 1220 has to be inputs of the first input group (i.e., inputs IN(0), . . . , IN(26)), to satisfy the circular nature of the shifting of the circulant by the shifting module 1220. Thus, the shifting module 1220 has to receive inputs IN(0), . . . , IN(26), i.e., inputs of the first input group as the top one third input of the shifting module 1220. Accordingly, the multiplexers M27, . . . , M53 selectively output respective inputs of the first input group (i.e., inputs IN(0), . . . , IN(26)). For example, the multiplexer M27 outputs input IN(0); the multiplexer M28 outputs input IN(1); the multiplexer M53 outputs input IN(26); and so on, as illustrated in FIG. 12D. Thus, the shifting module 1220 receives, as the top third input, the inputs of the first input group via the multiplexers M27, . . . , M53. Furthermore, the shifting module 1220 receives the number P from the multiplexer M54. The shifting module 1220 shifts the received inputs by P, and outputs output O(0), . . . , O(80), based on shifting the received inputs. As the circulant size in FIG. 12D is 54, the outputs O(0), . . . , O(53) are considered for further processing, and the remaining outputs O(54), . . . , O(80) are discarded or not considered for further processing.

Figure 12E:
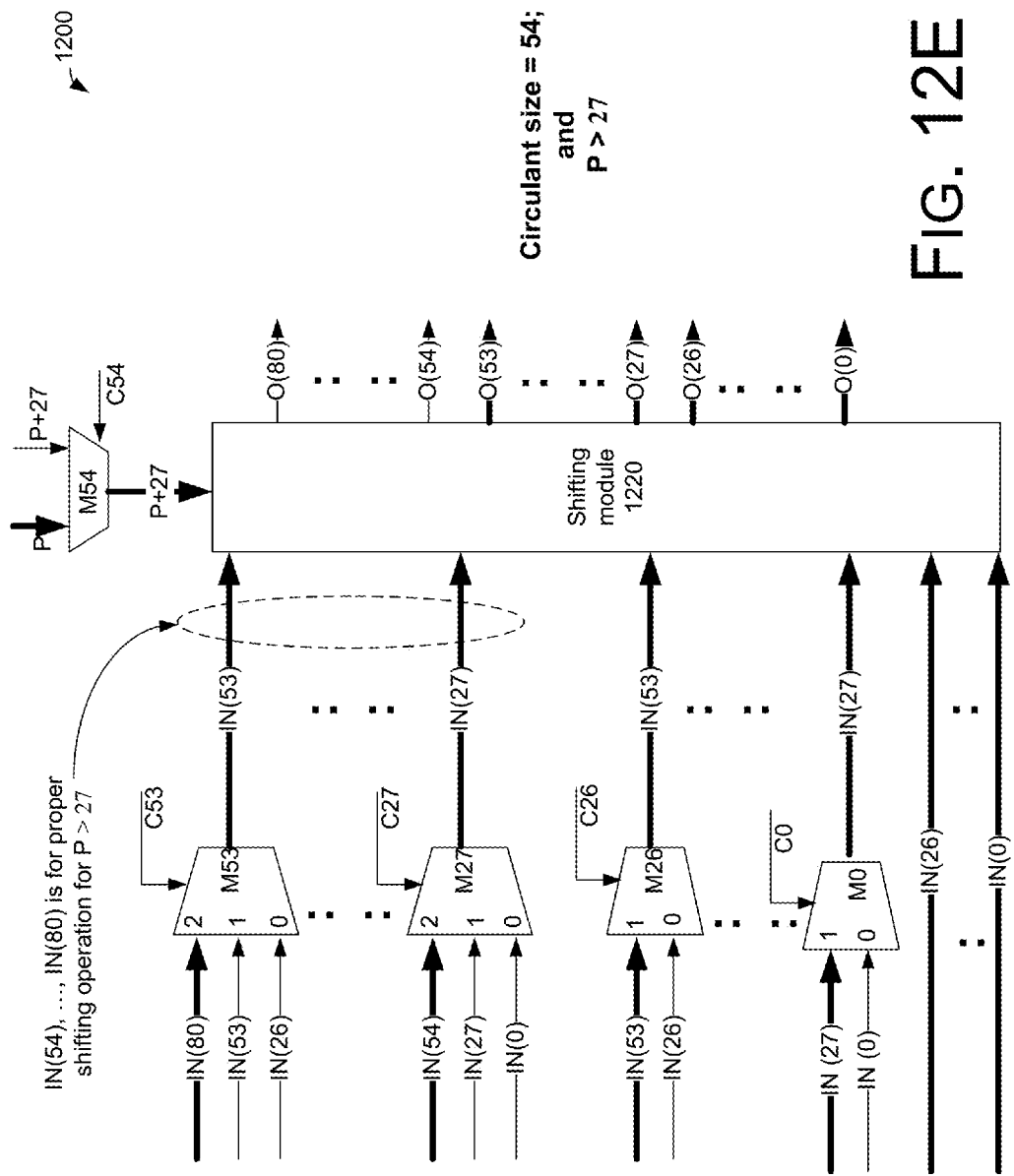

FIG. 12E illustrates another example operation of the circuit 1200 of FIG. 12A. In the example of FIG. 12E, the circulant size is assumed to be 54, and the number P by which the elements of the circulants are to be shifted is assumed to be greater than 27 (i.e., 81>P>27).

FIG. 12E is, at least in part, similar to FIG. 12D. For example, in FIG. 12E, as the circulant size is 54, inputs of the first and second input groups (i.e., inputs IN(0), . . . , IN(53)) represent valid inputs of the circuit 1200. Furthermore, similar to FIG. 12D, in FIG. 12E, the shifting module 1220 receives the inputs of the first input group directly, i.e., by bypassing the multiplexers. The multiplexers M0, . . . , M26 selectively outputs respective inputs of the second input group (i.e., inputs IN(27), . . . , IN(53)). For example, the multiplexer M0 outputs input IN(27); the multiplexer M1 outputs input IN(28); the multiplexer M26 outputs input IN(53); and so on, as illustrated in FIG. 12E. Thus, the shifting module 1220 receives the inputs of the second input group via the multiplexers M0, . . . , M26.

Unlike FIG. 12D, in FIG. 12E, as P>27, the top one third input of the shifting module 1220 has to be inputs of the second input group (i.e., inputs IN(27), IN(53)), to satisfy the circular nature of the shifting of the circulant by the shifting module 1220. Thus, the shifting module 1220 has to receive inputs IN(27), . . . , IN(80), i.e., inputs of the second input group as the top one third input of the shifting module 1220. Accordingly, the multiplexers M27, . . . , M53 selectively outputs respective inputs of the second input group (i.e., inputs IN(27), . . . , IN(53)). For example, the multiplexer M27 outputs input IN(27); the multiplexer M28 outputs input IN(28); the multiplexer M53 outputs input IN(53); and so on, as illustrated in FIG. 12E. Thus, the shifting module 1220 receives, as the top third input, the inputs of the second input group via the multiplexers M27, . . . , M53. Furthermore, the shifting module 1220 receives the number (P+27) from the multiplexer M54. The shifting module 1220 appropriately shifts the received inputs, and outputs output O(0), . . . , O(80), based on shifting the received inputs. As the circulant size in FIG. 12E is 54, the outputs O(0), . . . , O(53) are considered for further processing, and the remaining outputs O(54), . . . , O(80) are discarded or not considered for further processing.

Referring to FIGS. 12A-12E, the circuit 1200 is configured to process circulants of sizes 27, 54 and 81, by appropriately configuring the various multiplexers M0, . . . , M55 of the circuit 1200. The circuit 1200 comprises multiplexers M0, . . . , M54. Also, the shifting module 1220 includes (81×7), i.e., 567 multiplexers (e.g., to shift 81 possible inputs to the shifting module 1200). Thus, the circuit 1200 includes a total of (55+567), i.e., 622 multiplexers. In contrast, as previously discussed, a convention LDPC decoder, which supports circulant sizes of 27, 54 and 81, includes at least 1026 multiplexers. Thus, the circuit 1200 is configured to process circulants of sizes 27, 54 and 81, using a lower number of multiplexers (e.g., compared to a conventional LDPC decoder).

Reconfigurable LLR Pre-Processing

Referring again to FIG. 1, LDPC decoder 118 determines and processes LLR values associated with data received over the channel 106. LLR values of data received over the channel 106 are based on a variety of factors, e.g., a quality of the channel 106, a number of transmit antennas coupled to the transmitter 112, a number of receive antennas coupled to the receiver 114, and/or the like. Accordingly, a distribution of LLR values of data received over the channel 106 can have a large variance.

Figure 13A:
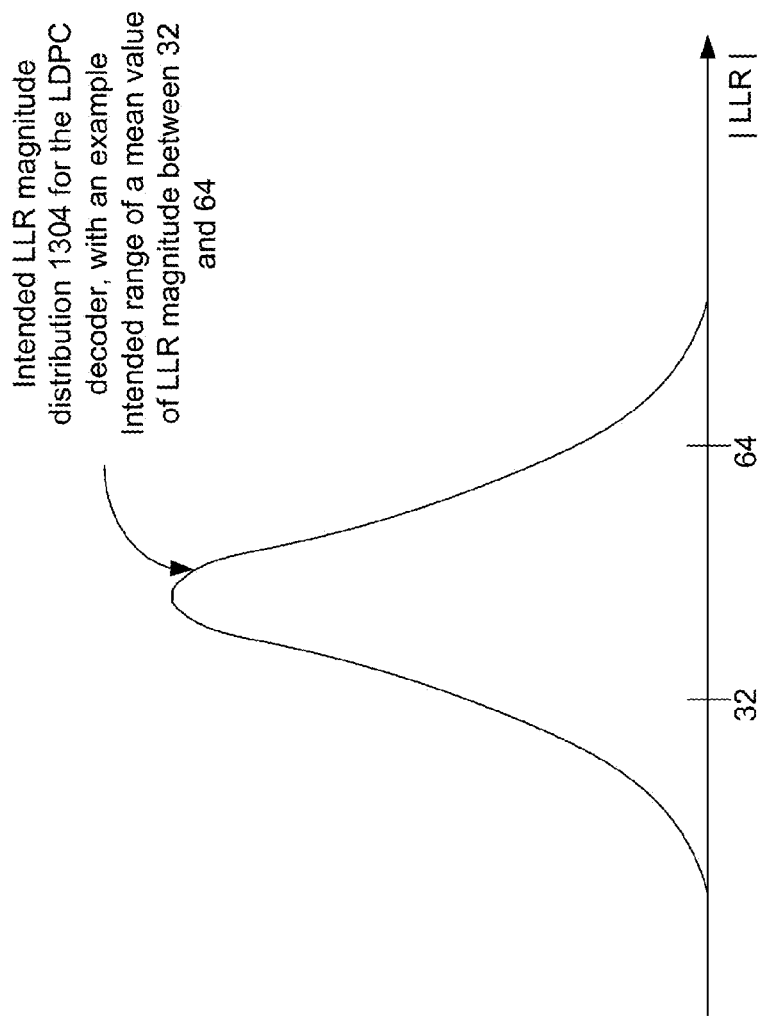
FIG. 13A illustrates an intended LLR magnitude distribution for an LDPC decoder.

In an embodiment, for optimal or near optimal (or relatively accurate or faster) operation of the LDPC decoder 118, it may be intended that a distribution of magnitude of the LLR values of the received codewords be within a certain range. For example, FIG. 13A illustrates an intended LLR magnitude distribution 1304 for the LDPC decoder 118, with an example Intended range of a mean value of LLR magnitude between 32 and 64. The intended LLR magnitude distribution 1304, for example, ensures optimal or near optimal (or relatively accurate) operation of the LDPC decoder 118. It is to be noted that the intended LLR magnitude distribution 1304 is merely an example, and does not limit the scope of this disclosure.

Figure 13B:
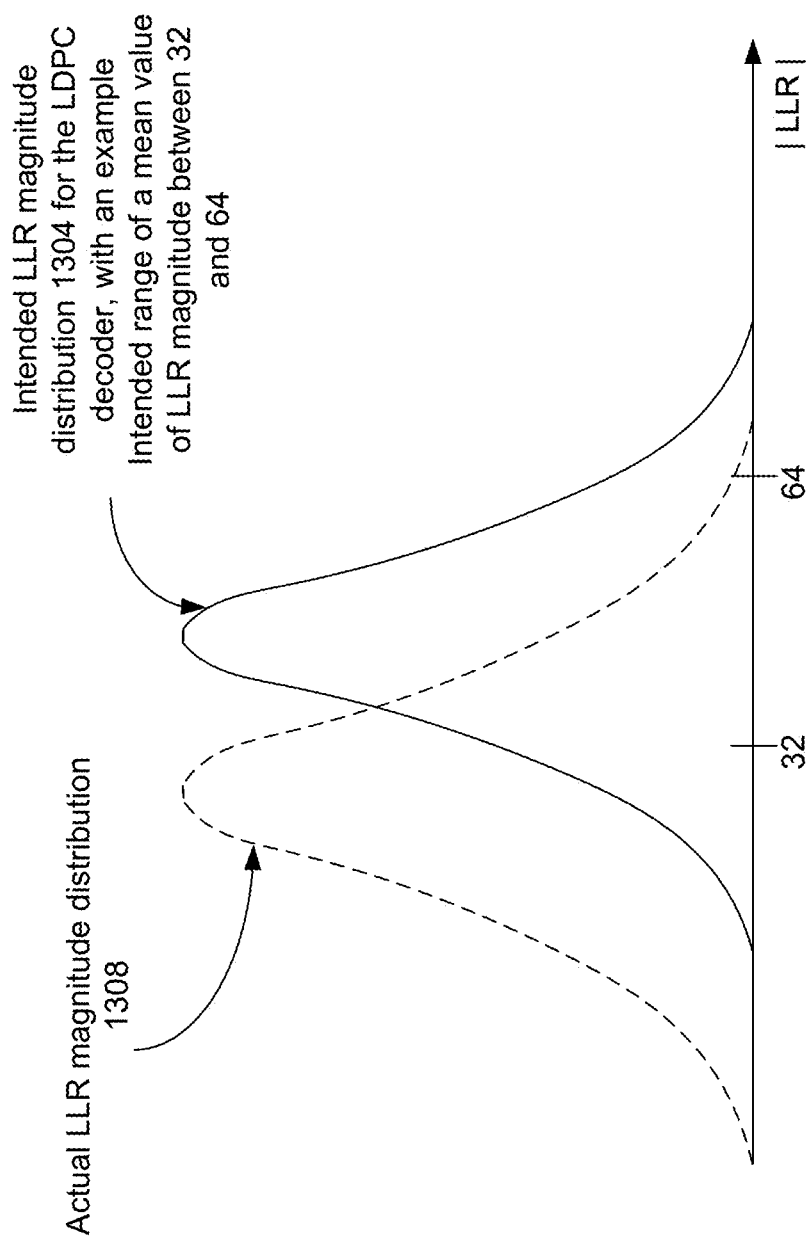
FIGS. 13B and 13C illustrate example actual LLR magnitude distributions.
Figure 13C:
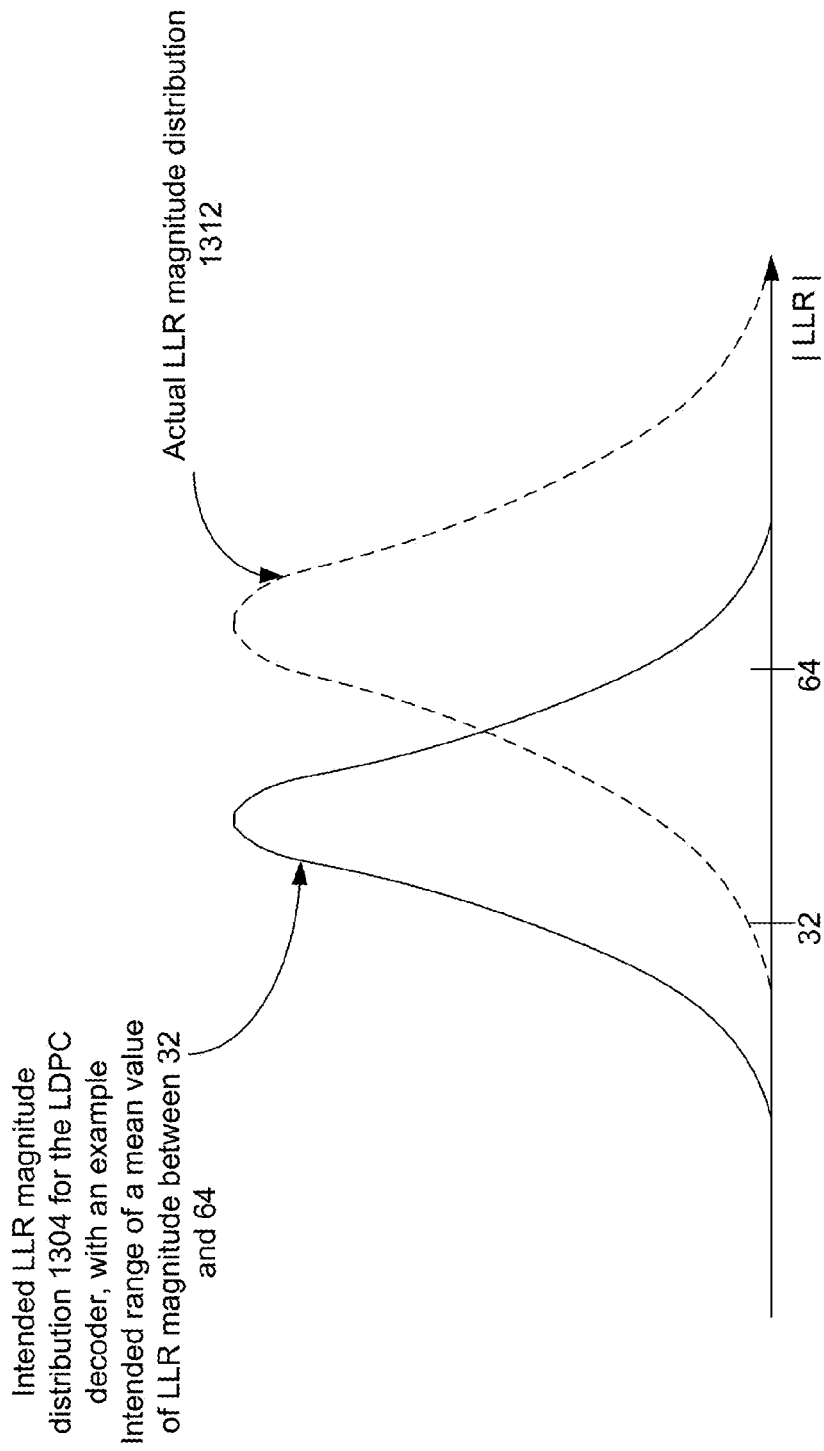

However, as illustrated in FIGS. 13B and 13C, an actual LLR magnitude distribution may be different from the intended LLR magnitude distribution 1304. For example, FIG. 13B illustrates an actual LLR magnitude distribution 1308 (illustrated using dotted lines), which has a range of mean values that is lower than that of the intended LLR magnitude distribution 1304. In another example, FIG. 13C illustrates an actual LLR magnitude distribution 1312 (illustrated using dotted lines), which has a range of mean values that is higher than that of the intended LLR magnitude distribution 1304.

In an embodiment, the actual LLR magnitude distributions 1308 and/or 1312 are generated dynamically. For example, as and when more data is received by the receiver 114, the actual LLR magnitude distributions 1308 and/or 1312 are updated. In an embodiment, the actual LLR magnitude distributions 1308 and/or 1312 are generated using moving average, and/or a moving time window. For example, older LLR values are discarded or given less weightage or less emphasis, and newer LLR values are given more weightage or more emphasis while generating and/or updating the actual LLR magnitude distributions 1308 and/or 1312.

In an embodiment, the actual LLR values are scaled to generate scaled LLR values (and generate corresponding scaled LLR magnitude distribution). The scaling is performed in a manner such that the scaled LLR magnitude distribution is closer to the intended LLR magnitude distribution 1304, compared to the actual LLR magnitude distribution.

For example, to make the actual LLR magnitude distribution 1308 of FIG. 13B closer to the intended LLR magnitude distribution 1304, one or more LLR values of the actual LLR magnitude distribution 1308 is scaled (e.g., multiplied) by a factor that is greater than one (e.g., by a factor of 1.2), so that the mean range of the LLR magnitude of the scaled LLR magnitude distribution increases and gets closer to the intended LLR magnitude distribution 1304. For similar reasons, one or more LLR values of the actual LLR magnitude distribution 1312 of FIG. 13C are scaled (e.g., multiplied) by a factor that is less than one (e.g., by a factor of 0.8).

Figure 14:
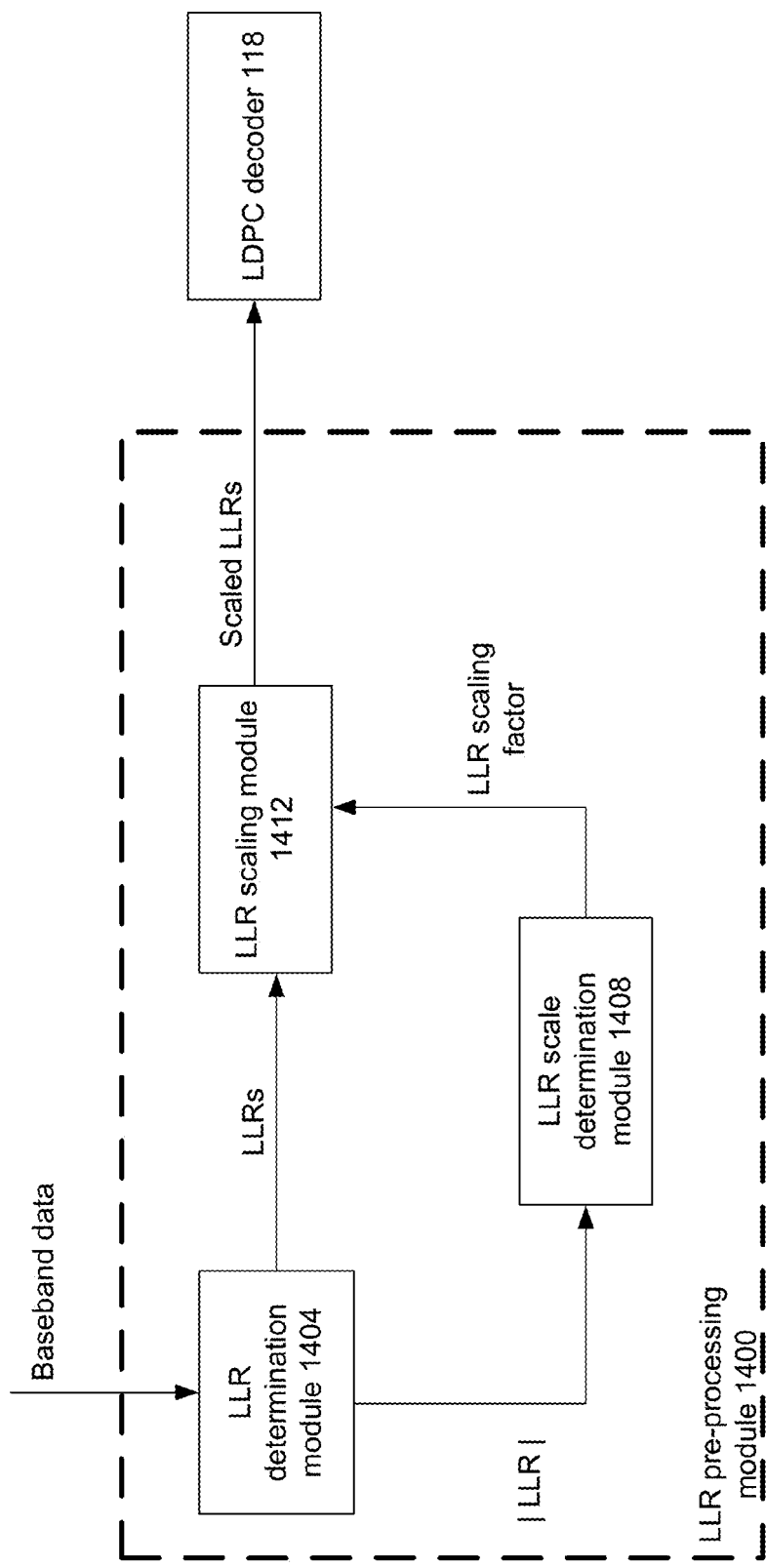
FIG. 14 illustrates an LLR pre-processing module for pre-processing LLR values, prior to transmitting the LLR values to an LDPC decoder.

FIG. 14 illustrates an LLR pre-processing module 1400 (illustrated using dotted lines in FIG. 14) for pre-processing LLR values, prior to transmitting the LLR values to the LDPC decoder 118. The LLR pre-processing module 1400 receives baseband data (e.g., comprising encoded codewords) from, for example, the receiver 114 of FIG. 1. The LLR pre-processing module 1400 comprises a LLR determination module 1404 for determining LLR values of the incoming codewords.

In an embodiment, the LLR pre-processing module 1400 further comprises a LLR scale determination module 1408 configured to receive magnitude of the LLR values from the LLR determination module 1404, as illustrated in FIG. 14. In another embodiment, the LLR scale determination module 1408 receives the LLR values from the LLR determination module 1404, and determines the magnitude of the LLR values from the received LLR values.

In an embodiment, the LLR scale determination module 1408 determines an LLR scaling factor, based on the magnitude of the LLR values. For example, the LLR scale determination module 1408 determines, from the magnitude of the LLR values, an actual distribution of LLR magnitudes. The LLR scale also accesses an optimal, near optimal or an intended distribution of LLR magnitudes. In an embodiment, based on a difference between the actual distribution of LLR magnitudes and the intended distribution of LLR magnitudes, the LLR scale determination module 1408 determines the LLR scaling factor.

In an embodiment, the LLR pre-processing module 1400 further comprises a LLR scaling module 1412. The LLR scaling module 1412 receives (i) the LLR values from the LLR determination module 1404 and (ii) the LLR scaling factor from the LLR scale determination module 1408. The LLR scaling module 1412 scales the received LLR values by the scaling factor, to generate scaled LLR values. In an embodiment, the LLR scaling module 1412 comprises adders and/or multipliers for scaling the LLR values. The LDPC decoder 118 receives the scaled LLR values, and decodes the codeword based on the received scaled LLR values.

Figure 15B:
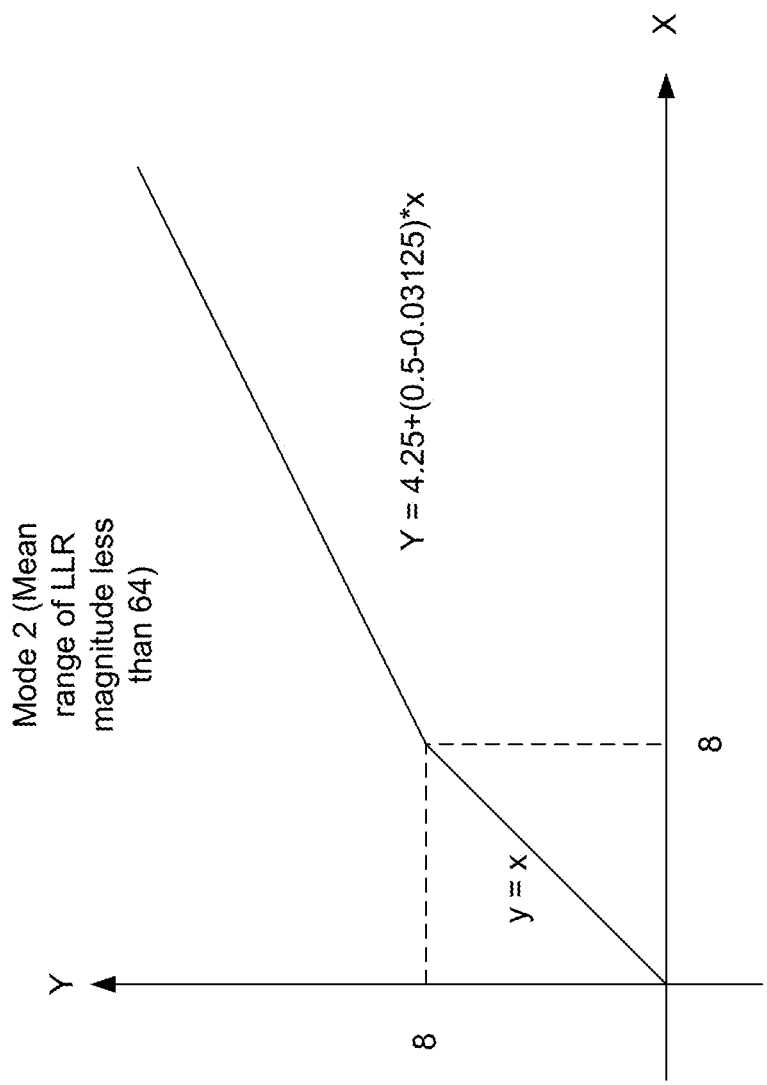

FIGS. 15A and 15B illustrate example scaling of LLR values by the LLR pre-processing module 1400. In FIGS. 15A and 15B, the x axis represent actual LLR values, and the y axis represent scaled LLR values (e.g., as scaled by the LLR scaling module 1412).

Referring to FIGS. 14 and 15A, the scaling illustrated in FIG. 15A is applied while the LLR pre-processing module 1400 operates in a first mode (e.g., a mode 1). The LLR pre-processing module 1400 operates in mode 1 when, for example, a mean range of actual LLR magnitude exceeds 64, e.g., as illustrated in FIG. 13C. The scaling of FIG. 15A is non-linear. For example, the scaling is performed based on the following: if $x \geq 5$, then $y=x$; and if $x>5$, then $Y=4.25+(0.25-0.03125) \cdot x$.

Referring to FIGS. 14 and 15B, the scaling illustrated in FIG. 15A is applied while the LLR pre-processing module 1400 operates in a second mode (e.g., a mode 2). The LLR pre-processing module 1400 operates in mode 2 when, for example, a mean range of LLR magnitude is less than 64, e.g., as illustrated in FIG. 13B. The scaling of FIG. 15B is non-linear. For example, the scaling of FIG. 15B is performed based on the following: if $x \leq 8$, then $y=x$; and if $x>8$, then $Y=4.25+(0.5-0.03125) \cdot x$.

In FIGS. 15A and 15B, the LLR values having a relatively low magnitude are not scaled (e.g., in FIG. 15A, LLR values having a magnitude of less than 5 are not scaled). This ensures, for example, that low magnitude LLRs retain the associated LLR information and is not scaled near to zero. Also, the slope of the scaling curve (e.g., for higher LLR values) in FIG. 15A is relatively less compared to that of FIG. 15B. That is, the LLR values in mode 1 are scaled using a lower scaling factor compared to that in mode 2. This ensures, for example, that the LLR values in mode 1, which are higher than the mean range of 64, are scaled such that the scaled LLR values are within the intended mean range.

Figure 16:
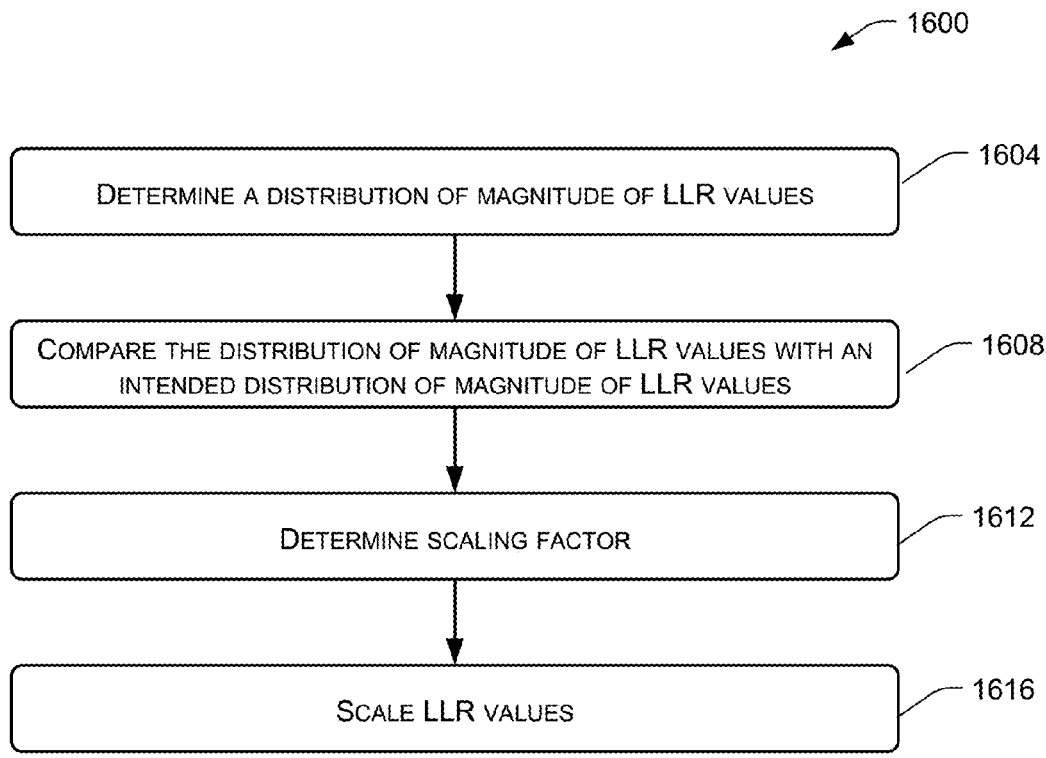
FIG. 16 is a flowchart illustrating scaling of LLR values prior to processing the LLR values by an LPDC decoder.

FIG. 16 is a flowchart 1600 illustrating scaling of LLR values prior to processing the LLR values by the LPDC decoder 118. At 1604, a distribution of magnitude of LLR values is determined (e.g., by the LLR scale determination module 1408). At 1608, the distribution of magnitude of LLR values is compared (e.g., by the LLR scale determination module 1408) with an intended distribution of magnitude of LLR values. At 1612, a scaling factor is determined (e.g., by the LLR scale determination module 1408), based on the comparison. At 1616, LLR values are scaled (e.g., by the LLR scaling module 1412), based on the determined scaling factor.

The description above incorporates use of the phrases "in an embodiment," or "in various embodiments," or the like, which may each refer to one or more of the same or different embodiments. Furthermore, the terms "comprising," "including," "having," and the like, as used with respect to embodiments of the present disclosure, are synonymous.

As used herein, the terms "logic," "component," and "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality. The logic and functionality described herein may be implemented by any such components.

In accordance with various embodiments, an article of manufacture may be provided that includes a storage medium having instructions stored thereon that, if executed, result in the operations described above. In an embodiment, the storage medium comprises some type of non-transitory memory (not shown). In accordance with various embodiments, the article of manufacture may be a computer-readable medium such as, for example, software or firmware.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This application is intended to cover any adaptations or variations of the embodiments discussed herein. Therefore, it is manifestly intended that embodiments in accordance with the present disclosure be limited only by the claims and the equivalents thereof.

What is claimed is:

1. A method of decoding codewords in conjunction with a low-density parity-check (LDPC) code, the method comprising:
   receiving, via a receiver associated with an LDPC decoder, a first codeword over a data channel;
   setting, based on the first code word, values of a first LDPC matrix stored in a belief memory of the LDPC decoder, the values of the first LDPC matrix corresponding to respective bit values of the first codeword;
   receiving, via the receiver associated with the LDPC decoder, a second codeword over the data channel;
   setting, based on the second codeword, values of a second LDPC matrix stored in the belief memory of the LDPC decoder, the values of the second LDPC matrix corresponding to respective bit values of the second codeword;
   decoding, via the LDPC decoder, the first codeword with the first LDPC matrix and the second codeword with the second LDPC matrix to provide first decoded data and second decoded data, respectively, wherein the decoding of the first codeword and the second codeword comprises:
      reading, during a first time period and from the belief memory, a first layer of the first LDPC matrix associated with the first codeword;
      reading, during a second time period and from the belief memory, a first layer of the second LDPC matrix associated with the second codeword; and
      updating, during the second time period and to the belief memory, the first layer of the first LDPC matrix associated with the first codeword, wherein the first layer of the first LDPC matrix is updated at least in part simultaneously with reading the first layer of the second LDPC matrix such that the first codeword and the second codeword are decoded at least partially in parallel.

2. The method of claim 1, further comprising:
   receiving a third codeword via the receiver associated with the LDPC decoder; and
   decoding, via the LDPC decoder, the second codeword with the second LDPC matrix and the third codeword with a third LDPC matrix to further provide third decode data, wherein decoding the second codeword and the third codeword comprises:
      updating, during a third time period and to the belief memory, the first layer of the second LDPC matrix associated with the second codeword; and
      reading, during the third time period and from the belief memory, a first layer of the third LDPC matrix associated with the third codeword.

3. The method of claim 2, further comprising:
   receiving a fourth codeword via the receiver associated with the LDPC decoder; and
   decoding, via the LDPC decoder and at least partially in parallel, the third codeword with the third LDPC matrix and the fourth codeword with a fourth LDPC matrix to further provide fourth decoded data, wherein decoding the third codeword and the fourth codeword comprises:
      iteratively reading and updating a plurality of layers of the third LDPC matrix that is associated with decoding the third codeword, and
      iteratively reading and updating a plurality of layers of the fourth LDPC matrix that is associated with decoding the fourth codeword, wherein while a layer of the plurality of layers of the third LDPC matrix is being read, a layer of the plurality of layers of the fourth LDPC matrix is being updated.

4. The method of claim 1, wherein:
reading the first layer of the first LDPC matrix associated with the first codeword comprises reading the first layer of the first LDPC matrix from the belief memory; and
updating the first layer of the first LDPC matrix associated with the first codeword comprises:
subsequent to reading the first layer of the first LDPC matrix from the belief memory, modifying the first layer of the first LDPC matrix to provide a modified first layer of the first LDPC matrix, and
subsequent to modifying the first layer of the first LDPC matrix, writing the modified first layer of the first LDPC matrix to the belief memory.

5. The method of claim 1, wherein:
the first LDPC matrix comprises a plurality of circulants arranged in rows and columns; or
the second LDPC matrix comprises a plurality of circulants arranged in rows and columns.

6. The method of claim 5, at least one circulant of the plurality of circulants of the first LDPC matrix or second LDPC matrix is a square matrix with individual entries being either zero or one.

7. The method of claim 1, wherein:
setting the values of the first LDPC matrix stored in the belief memory of the LDPC decoder comprises setting values of columns of the first LDPC matrix based on the bits of the first codeword; or
setting the values of the second LDPC matrix stored in the belief memory of the LDPC decoder comprises setting values of columns of the second LDPC matrix based on the bits of the second codeword.

8. The method of claim 7, wherein:
the first LDPC matrix corresponds to a plurality of variable nodes and a plurality of check nodes of the LDPC code, the columns of the first LDPC matrix correspond to the plurality of variable nodes, and rows of the first LDPC matrix correspond to the plurality of check nodes; or
the second LDPC matrix corresponds to a plurality of variable nodes and a plurality of check nodes of the LDPC code, the columns of the second LDPC matrix correspond to the plurality of variable nodes, and rows of the second LDPC matrix correspond to the plurality of check nodes.

9. The method of claim 1, wherein the first codeword or the second codeword is received by the receiver as modulated data and the method further comprises demodulating the modulated data to provide the first codeword or the second codeword to the LDPC decoder.

10. The method of claim 1, wherein the data channel over which the first codeword and second codeword are received comprises one of a wired communication channel or a wireless communication channel.

11. A system comprising
a receiver configured to receive, via a data channel, at least a first codeword and at least a second codeword that are encoded in accordance with a parity-check code;
a decoder for decoding codewords received over the data channel by using a parity-check code that defines variable nodes and check nodes, the decoder comprising:
a belief memory configured to store one or more parity-check code matrices that correspond to the variable nodes and check nodes for decoding one of the codewords;
a processor-based node updater configured to update the variable nodes and check nodes stored in the memory; wherein the decoder is configured to decode the first codeword and the second code by:
setting, based on the first codeword, values of a first parity-check code matrix stored in the belief memory of the decoder, the values of the first parity-check code matrix corresponding to respective bit values of the first codeword;
setting, based on the second codeword, values of a second parity-check code matrix stored in the belief memory of the decoder, the values of the second parity-check code matrix corresponding to respective bit values of the second codeword;
reading, during a first time period and via the node updater, a first layer of the first parity-check code matrix from the memory;
reading, during a second time period and via the node updater, a first layer of the second first parity-check code matrix from the memory; and
updating, during the second time period and via the node updater, the first layer of the first parity-check code matrix to the belief memory, wherein the first layer of the first parity-check code matrix is updated at least in part simultaneously with reading the first layer of the second parity-check code matrix such that the first codeword and the second codeword are decoded at least partially in parallel.

12. The system of claim 11, wherein the receiver is further configured to receive a third codeword via the data channel and the decoder is further configured to:
decode the second codeword with the second parity-check code matrix and the third codeword with a third parity-check code matrix by:
updating, during a third time period and to the belief memory, the first layer of the second parity-check code matrix; and
reading, during the third time period and from the belief memory, a first layer of the third parity-check code matrix.

13. The system of claim 12, wherein the receiver is further configured to receive a fourth codeword via the data channel and the decoder is further configured to:
decode the third codeword with the third parity-check code matrix and the fourth codeword with a fourth parity-check code matrix by:
iteratively reading and updating a plurality of layers of the third parity-check code matrix that is associated with decoding the third codeword; and
iteratively reading and updating a plurality of layers of the fourth parity-check code matrix that is associated with decoding the fourth codeword, wherein while a layer of the plurality of layers of the third parity-check code matrix is being read, a layer of the plurality of layers of the fourth parity-check code matrix is being updated.

14. The system of claim 11, wherein:
the first parity-check code matrix comprises a plurality of circulants arranged in rows and columns; or
the second parity-check code matrix comprises a plurality of circulants arranged in rows and columns.

15. The system of claim 14, at least one circulant of the plurality of circulants of the first parity-check code matrix or the second parity-check code matrix is a square matrix with individual entries being either zero or one.

16. The system of claim 11, wherein the decoder is further configured to:
refrain, during a third time period, from using the node updater to read any layer of the first parity-check code matrix or the second parity-check code matrix from the belief memory; and
operate, during the third time period, the belief memory or the node updater in a low power mode; or
refrain, during the third time period, from using the node updater to update any layer of the first parity-check code matrix or the second parity-check code matrix; and
operate, during the third time period, the belief memory or the node updater in a low power mode.

17. The system of claim 11, wherein:
setting the values of the first parity-check code matrix stored in the belief memory of the decoder comprises setting values of columns of the first parity-check code matrix based on the bits of the first codeword; or
setting the values of the second parity-check code matrix stored in the belief memory of the decoder comprises setting values of columns of the second parity-check code matrix based on the bits of the second codeword.

18. The system of claim 17, wherein:
the first parity-check code matrix corresponds to the variable nodes and check nodes of the parity-check code, the columns of the first parity-check code matrix correspond to the variable nodes, and rows of the first parity-check code matrix correspond to the check nodes; or
the second parity-check code matrix corresponds to the variable nodes and check nodes of the parity-check code, the columns of the second parity-check code matrix correspond to the plurality of variable nodes, and rows of the second parity-check code matrix correspond to the plurality of check nodes.

19. The system of claim 11, wherein the first codeword or the second codeword is received by the receiver as modulated data and the system further comprises a demodulator configured to demodulate the modulated data to provide the first codeword or the second codeword to the decoder of the system.

20. The system of claim 11, wherein the data channel over which the first codeword and second codeword are received comprises one of a wired communication channel or a wireless communication channel.

* * * * *